(12) United States Patent
Ye et al.

(10) Patent No.: US 10,944,032 B2
(45) Date of Patent: Mar. 9, 2021

(54) LIGHT EMITTING DIODE ASSEMBLY STRUCTURE

(71) Applicant: HARVATEK CORPORATION, Hsinchu (TW)

(72) Inventors: Zhi-Ting Ye, Hsinchu (TW);
Shyi-Ming Pan, Hsinchu (TW);
Chih-Wei Chang, Hsinchu (TW)

(73) Assignee: HARVATEK CORPORATION, Hsinchu (TW)

( * ) Notice: Subject to any disclaimer, the term of this patent is extended or adjusted under 35 U.S.C. 154(b) by 0 days.

(21) Appl. No.: 16/655,268

(22) Filed: Oct. 17, 2019

(65) Prior Publication Data
US 2020/0052171 A1 Feb. 13, 2020

Related U.S. Application Data

(62) Division of application No. 15/472,203, filed on Mar. 28, 2017, now abandoned.

(30) Foreign Application Priority Data

Jul. 26, 2016 (TW) .................................. 105211295

(51) Int. Cl.
*H01L 33/60* (2010.01)
*H01L 33/50* (2010.01)
(Continued)

(52) U.S. Cl.
CPC ............ *H01L 33/60* (2013.01); *H01L 33/505* (2013.01); *H01L 33/54* (2013.01); *H01L 33/56* (2013.01);
(Continued)

(58) Field of Classification Search
CPC ......... H01L 33/60; H01L 33/56; H01L 33/58; H01L 33/502; H01L 2933/0091;
(Continued)

(56) References Cited

U.S. PATENT DOCUMENTS

2005/0139846 A1   6/2005  Park et al.
2011/0084896 A1*  4/2011  Ito ....................... H01L 51/5271
                                                           345/82
(Continued)

FOREIGN PATENT DOCUMENTS

CN      1674315 A     9/2005
CN    202008997 U    10/2011
(Continued)

*Primary Examiner* — Marcos D. Pizarro
*Assistant Examiner* — Antonio B Crite
(74) *Attorney, Agent, or Firm* — ScienBiziP, P.C.

(57) ABSTRACT

A light emitting diode assembly structure includes a light emitting chip, a color converting layer, a light guiding member, and a reflecting member. The color converting layer coats the light emitting chip and the light guiding member coats the color converting layer. The planar or non-planar reflecting member is arranged over the light guiding member. The reflecting member faces toward the light emitting chip and changes the range of illumination of the light emitted by the light emitting chip. The reflecting member can be arranged on a side of the color converting layer and light can be irradiated towards the exterior of the light emitting diode assembly structure.

18 Claims, 17 Drawing Sheets

(51) Int. Cl.
  *H01L 33/54* (2010.01)
  *H01L 33/56* (2010.01)
  *H01L 33/58* (2010.01)
(52) U.S. Cl.
  CPC ...... *H01L 33/58* (2013.01); *H01L 2933/0058* (2013.01); *H01L 2933/0091* (2013.01)
(58) Field of Classification Search
  CPC .......... H01L 2933/0058; H01L 33/50–33/505; H01L 33/54
  See application file for complete search history.

(56) References Cited

U.S. PATENT DOCUMENTS

| | | | | |
|---|---|---|---|---|
| 2011/0140148 | A1* | 6/2011 | Liu | G02B 19/0061 257/98 |
| 2012/0061702 | A1 | 3/2012 | Andrews et al. | |
| 2013/0070441 | A1 | 3/2013 | Moon et al. | |
| 2014/0071689 | A1* | 3/2014 | Yoon | F21V 13/04 362/296.01 |
| 2015/0188011 | A1* | 7/2015 | Kang | H01L 33/60 257/98 |
| 2015/0263239 | A1* | 9/2015 | Watanabe | F21V 13/14 362/293 |
| 2015/0263254 | A1* | 9/2015 | Miyoshi | H01L 33/505 257/98 |
| 2016/0190406 | A1* | 6/2016 | Liu | H01L 33/505 257/98 |
| 2017/0023188 | A1* | 1/2017 | Mima | H01S 5/005 |
| 2017/0317251 | A1* | 11/2017 | Sweegers | H01L 33/507 |

FOREIGN PATENT DOCUMENTS

| | | | | |
|---|---|---|---|---|
| CN | 101622723 B | 5/2012 | | |
| CN | 102646784 A | 8/2012 | | |
| CN | 202403190 U | 8/2012 | | |
| CN | 103730560 A | 4/2014 | | |
| TW | 201432960 A | 8/2014 | | |
| WO | 2007140651 A1 | 12/2007 | | |
| WO | WO-2016009088 A1 * | 1/2016 | ............. | H01L 33/46 |

\* cited by examiner

LIGHT EMITTING DIODE ASSEMBLY STRUCTURE

FIELD

The subject matter herein generally relates to light emitting diode assembly structures.

BACKGROUND OF THE INVENTION

Light emitting diode products can be seen everywhere, such as traffic signals, automobile lamps, street lamps, lights or flashlights. These light emitting diode products need to process the light emitting chip, and the light emitting chip needs to be packaged with a light emitting diode assembly structure.

The light emitting diode assembly structure improves the power supply to the light emitting chip and improves light radiation efficiency of the light emitting chip. When the light emitting chip is exposed to an atmosphere for a long time, there may be deterioration due to an influence of chemicals in the atmosphere or other environment, thereby causing the light emitting chip accelerated deterioration. At present, the light emitting chip may be coated with a high-transparency epoxy resin, which effectively seals out the atmosphere. A suitable packaging substrate can provide better protection for the light emitting diode assembly structure, and a life of the light emitting chip may be improved. Although high transparency epoxy used, the epoxy coverage over the LED still reduces the light extracting efficiency.

Optical design is also an important part of the packaging process. At present, a secondary optical lens may be arranged on the light emitting diode, which can change the light emitting angles. However, the secondary optical lens is not easy to assemble, and increases cost.

The following detailed descriptions of exemplary embodiments are to be considered in combination with the accompanying figures. As will be realized, the subject matter disclosed and claimed is capable of modifications in various respects, all without departing from the scope of the claims. Accordingly, the drawings and the description are to be regarded as illustrative in nature, and not as restrictive in relation to the full scope of the subject matter as set forth in the claims.

SUMMARY

The present disclosure provides a light emitting diode assembly structure having a light guiding member and a reflecting member.

The light emitting diode assembly structure includes a light emitting chip, a color converting layer, a light guiding member, and a reflecting member. The color converting layer is coated on the light emitting chip. The light guiding member is arranged over the color converting layer. The reflecting member is arranged over the light guiding member. The reflecting member comprises a first reflecting surface faced towards the light emitting chip, and wherein the first reflecting surface is a surface selected from the group consisting of a planar, a concave, a convex, a parabolic, a multi-segmented, a curved surface, and a combination thereof.

In an alternative exemplary embodiment, the light guiding member is coated on the color converting layer.

In an alternative exemplary embodiment, the light guiding member is arranged on a top surface of the color converting layer In an alternative exemplary embodiment, the light emitting chip is selected from the group consisting of a horizontal type light emitting diode chip, a vertical type light emitting diode chip, a flip chip type light emitting diode chip, and a combination thereof.

In an alternative exemplary embodiment, the light emitting diode assembly structure further includes a substrate arranged on a bottom surface of the light emitting chip.

In an alternative exemplary embodiment, the substrate includes a second reflecting surface faced towards the first reflecting surface of the reflecting member.

In an alternative exemplary embodiment, the light guiding member includes silicone and additional material. The weight of the additional material is within a range of about 5% to about 15% of the weight of the silicone. The additional material is selected from the group consisting of organic diffusion particles, inorganic diffusion particles, and a combination thereof.

In an alternative exemplary embodiment, a refractive index of the silicone is substantially in a range of 1.4 to 1.6. A refractive index of the additional material is substantially in a range of 1.5 to 1.8.

In an alternative exemplary embodiment, the organic diffusion particles comprise an organic silicone compound or an acrylic compound. The inorganic diffusion particles comprise silica or a calcium carbonate compound.

In an alternative exemplary embodiment, the light emitting diode assembly structure includes a light emitting chip, a color converting layer, a light guiding member, and a reflecting member. The light guiding member is arranged over the color converting layer. The color converting layer is arranged over the light guiding member. The reflecting member is arranged over the color converting layer. The reflecting member comprises a first reflecting surface faced towards the light emitting chip, and wherein the first reflecting surface is a surface selected from the group consisting of a planar, a concave, a convex, a parabolic, a multi-segmented, a curved surface, and a combination thereof.

In an alternative exemplary embodiment, the light guiding member is coated on the light emitting chip, and the color converting layer is coated on the light guiding member.

In an alternative exemplary embodiment, the light guiding member is arranged on the light emitting chip, and the light guiding member and the light emitting chip are coated by the color converting layer.

In an alternative exemplary embodiment, the reflecting member comprises a first reflecting surface faced towards the light emitting chip. The first reflecting surface is selected from the group consisting of a planar, a concave, a convex, a parabolic, a multi-segmented, a curved surface, and a combination thereof.

In an alternative exemplary embodiment, the light emitting chip is selected from the group consisting of a horizontal type light emitting diode chip, a vertical type light emitting diode chip, a flip chip type light emitting diode chip, and a combination thereof.

In an alternative exemplary embodiment, the light emitting diode assembly structure further comprises a substrate arranged on a bottom surface of the light emitting chip.

In an alternative exemplary embodiment, the substrate comprises a second reflecting surface faced towards the first reflecting surface of the reflecting member.

In an alternative exemplary embodiment, the light guiding member includes silicone and additional material. The weight of the additional material is within a range of about 5% to about 15% of the weight of the silicone. The additional material is selected from the group consisting of organic diffusion particles, inorganic diffusion particles, and a combination thereof.

In an alternative exemplary embodiment, a refractive index of the silicone is substantially in a range of 1.4 to 1.6. A refractive index of the additional material is substantially in a range of 1.5 to 1.8.

In an alternative exemplary embodiment, the organic diffusion particles comprise an organic silicone compound or an acrylic compound. The inorganic diffusion particles comprise silica or a calcium carbonate compound.

In an alternative exemplary embodiment, the light emitting diode assembly structure includes a light emitting chip, a color converting layer, a light guiding member, and a reflecting member. The color converting layer is coated on the light emitting chip. The reflecting member is arranged around a side of the color converting layer. The light guiding member is coated on a periphery of the color converting layer and the reflecting member. An inner surface of the reflecting member includes a reflecting surface faced towards the light emitting chip. The reflecting surface is symmetrical or asymmetrical under all rotations about its center.

In an alternative exemplary embodiment, the reflecting surface is selected from the group consisting of a planar, a concave, a convex, a parabolic, a multi-segmented, a curved surface, and a combination thereof.

In an alternative exemplary embodiment, the light guiding member includes a light exiting surface faced towards the light emitting chip. The light exiting surface is a continuous or discontinuous structure. The light exiting surface is substantially planar, arc-shaped, n-shaped, or v-shaped.

In an alternative exemplary embodiment, a width of the cross-section of the reflecting member increases gradually in a direction away from the light emitting chip.

In an alternative exemplary embodiment, the reflecting surface is a sealed and continuous surface.

In an alternative exemplary embodiment, the reflecting member is a substantially frustum.

In an alternative exemplary embodiment, the light guiding member includes silicone and additional material. The weight of the additional material is within a range of about 5% to about 15% of the weight of the silicone. The additional material is selected from the group consisting of organic diffusion particles, inorganic diffusion particles, and a combination thereof.

In an alternative exemplary embodiment, a refractive index of the silicone is substantially in a range of 1.4 to 1.6. A refractive index of the additional material is substantially in a range of 1.5 to 1.8.

In an alternative exemplary embodiment, the organic diffusion particles comprise an organic silicone compound or an acrylic compound. The inorganic diffusion particles comprise silica or a calcium carbonate compound.

A light emitting diode assembly structure includes a light emitting chip, a color converting layer coated on the light emitting chip, a light guiding member arranged over the light emitting chip, and a reflecting member arranged over the light guiding member. The reflecting member comprises a first reflecting surface faced towards the light emitting chip, and wherein the first reflecting surface is a surface selected from the group consisting of a planar, a concave, a convex, a parabolic, a multi-segmented, a curved surface, and a combination thereof. The reflecting member comprises a top surface and a bottom surface, and wherein the reflecting member arranges a groove. The groove penetrates the top and bottom surfaces of the reflecting member.

In an alternative exemplary embodiment, the groove is substantially symmetrical under all rotations about its center.

In an alternative exemplary embodiment, the groove is a cross-shaped groove or a circular groove.

In an alternative exemplary embodiment, a width of the groove is in a range from substantially 0.05 mm to substantially 0.3 mm.

In an alternative exemplary embodiment, the groove comprises an upper end portion opposite to the light guiding member and a lower end portion adjacent to the light guiding member, and wherein a width of the upper end portion is more than or equal to a width of the lower end portion.

In an alternative exemplary embodiment, the light guiding member includes silicone and additional material. The weight of the additional material is within a range of about 5% to about 15% of the weight of the silicone. The additional material is selected from the group consisting of organic diffusion particles, inorganic diffusion particles, and a combination thereof.

In an alternative exemplary embodiment, a refractive index of the silicone is substantially in a range of 1.4 to 1.6. A refractive index of the additional material is substantially in a range of 1.5 to 1.8.

In an alternative exemplary embodiment, the organic diffusion particles comprise an organic silicone compound or an acrylic compound. The inorganic diffusion particles comprise silica or a calcium carbonate compound.

A light emitting diode assembly structure includes a light emitting chip, a color converting layer coated on the light emitting chip, a light guiding member arranged over the light emitting chip, and a reflecting member, arranged over the light guiding member. The reflecting member comprises a first reflecting surface faced towards the light emitting chip, and wherein the first reflecting surface is a surface selected from the group consisting of a planar, a concave, a convex, a parabolic, a multi-segmented, a curved surface, and a combination thereof. The reflecting member comprises a first top surface and a first bottom surface. The light guiding member comprises a second top surface and a second bottom surface. The light emitting diode assembly structure arranges a groove. The groove penetrates from the first top surface of the reflecting member to a predetermined position between the second top surface of the light guiding member and the second bottom surface of the light guiding member. In an alternative exemplary embodiment, the groove is substantially symmetrical under all rotations about its center.

In an alternative exemplary embodiment, the groove is a cross-shaped groove or a circular groove.

In an alternative exemplary embodiment, a width of the groove is in a range from substantially 0.05 mm to substantially 0.3 mm.

In an alternative exemplary embodiment, the groove comprises an upper end portion opposite to the color converting layer and a lower end portion adjacent to the color converting layer, and wherein a width of the upper end portion is more than or equal to a width of the lower end portion.

In an alternative exemplary embodiment, the light guiding member includes silicone and additional material. The weight of the additional material is within a range of about 5% to about 15% of the weight of the silicone. The additional material is selected from the group consisting of organic diffusion particles, inorganic diffusion particles, and a combination thereof.

In an alternative exemplary embodiment, a refractive index of the silicone is substantially in a range of 1.4 to 1.6. A refractive index of the additional material is substantially in a range of 1.5 to 1.8.

In an alternative exemplary embodiment, the organic diffusion particles comprise an organic silicone compound or an acrylic compound. The inorganic diffusion particles comprise silica or a calcium carbonate compound.

According to the light emitting diode assembly structure of the present disclosure, the light guiding member directs the light emitted by the light emitting chip to irradiate towards the reflecting surface of reflecting member, so the radiated light can be reflected toward the exterior of the package, facilitate to the light emitted by the light emitting chip changing a light guiding path and a light pattern.

BRIEF DESCRIPTION OF THE DRAWINGS

Implementations of the present technology will now be described, by way of example only, with reference to the attached figures.

DETAILED DESCRIPTION

Figure 1A:
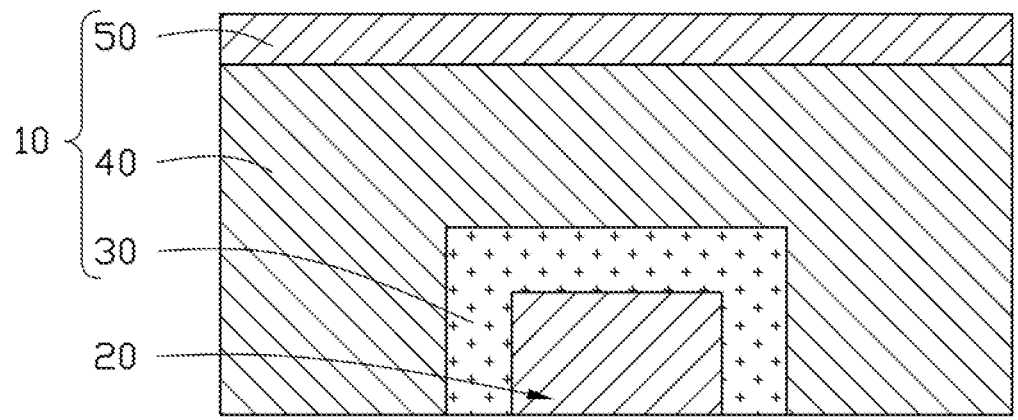
FIG. 1A is a schematic view of a light emitting diode assembly structure according to a first exemplary embodiment, the assembly including a reflecting member and a light guiding member.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the exemplary embodiments described herein.

Several definitions that apply throughout this disclosure will now be presented.

The term "substantially" means essentially conforming to the particular dimension, shape or other feature that the term modifies, such that the component need not be exact. For example, "substantially cylindrical" means that the object resembles a cylinder, but may have one or more deviations from a true cylinder. The term "comprising" or "containing" when utilized, means "including, but not necessarily limited to"; it specifically indicates open-ended inclusion or membership in the so-described combination, group, series and the like. The term "directing" is intended to mean providing a path or passage for something from one position into a destination position. The terms "first", "second", "third" and other terms in the present disclosure are only used as textual symbols as the circumstances may require, but such ordination is not limited to using only these terms. It should be further noted that these terms can be used interchangeably.

The present disclosure is described in relation to a light emitting diode assembly structure.

As shown in FIG. 1A, in the first exemplary embodiment, a light emitting diode assembly structure 1 includes a package 10 and a light emitting chip 20 encapsulated by the package 10. The package 10 includes a color converting layer 30, a light guiding member 40, and a reflecting member 50. The light emitting chip 20 is coated by the color converting layer 30. The color converting layer 30 is coated by the light guiding member 40. The reflecting member 50 is arranged over the light guiding member 40. The light emitting diode assembly structure 1 enables a wider angle of radiation of light emitted by the light emitting chip 20.

The light emitting chip 20 may be a chip selected from the group consisting of a horizontal type light emitting diode chip, a vertical type light emitting diode chip, a flip chip type light emitting diode chip, and a combination thereof. The type of light emitting chip 20 may be changed as prescribed by particular application requirement.

The color converting layer 30 is configured for changing a color of the light emitted by the light emitting chip 20. The color converting layer 30 may change the color of the light emitted by the light emitting chip 20 according to particular application requirement.

The light guiding member 40 may include, but is not limited to, polymerized siloxanes (i.e., silicone). The light guiding member 40 is any material with high transparency for coating the light emitting chip 20. The light guiding member 40 is configured to adjust the illumination range of the light emitted by the light emitting chip 20 and to guide the light to reach a pre-determined position.

The light guiding member 40 may further include additional material, so the light emitted by the light emitting chip 20 can be uniformly irradiated toward an exterior of the light emitting diode assembly structure 1. The weight of the additional material is within a range of about 5% to about 15% of the weight of the silicone. The additional material may include, but is not limited to, organic diffusion particles, inorganic diffusion particles, or any combination thereof.

A refractive index of the silicone is substantially in a range of 1.4 to 1.6. A refractive index of the additional material is substantially in a range of 1.5 to 1.8. The refractive index of the silicone may be different from the refractive index of the additional material. Thus, when the additional material is mixed with the silicone resin, the light emitted by the light emitting chip 20 can be scattered by the additional material within the light guiding member 40, so the light scattered by the additional material can be more uniform to irradiate toward the exterior of the light emitting diode assembly structure 1.

The organic diffusion particles may include, but is not limited to, an organic silicone compound or an acrylic compound. The inorganic diffusion particles may include, but is not limited to, silica ($SiO_2$), titanium dioxide ($TiO_2$) or a calcium carbonate compound. The organic silicone compound may be, but is not limited to, silicone rubber, silicone resin, or silicone oil. The acrylic compound may be, but is not limited to, poly(1-carboxyethylene), polymethyl methacrylate (PMMA), polytetrafluoroethylene (PTFE).

A thickness of the light guiding member 40 may be 0.4 mm.

Figure 1B:
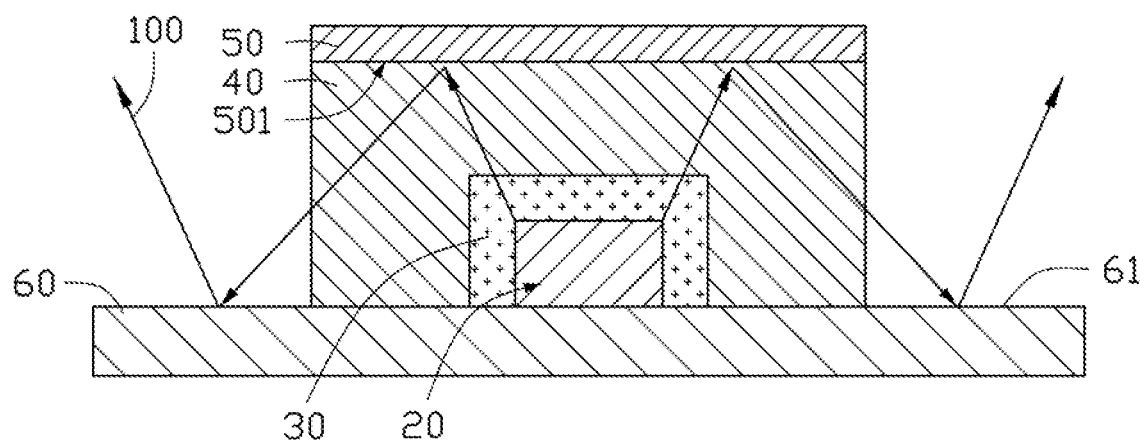
FIG. 1B is a schematic view of a light path of the light emitting diode assembly structure according to the first exemplary embodiment.

Referring to FIG. 1B, the reflecting member 50 includes a first reflecting surface 501. The first reflecting surface 501 faces toward the light emitting chip 20. The first reflecting surface 501 may be planar or non-planar.

In some embodiments, a thickness of the reflecting member 50 may be 0.4 mm.

A color of the first reflecting surface 501 may be a weak or faint color, in order to enhance an emission rate of the light emitted by the light emitting chip 20.

The overall color of the first reflecting surface 501 may be silver or white.

As shown in FIG. 1B, the light emitting chip 20 emits light 100. The light 100 passes through the color converting layer 30, which can change the color of the light 100 to a desired color. The light 100 passing through the color converting layer 30 is entered into the light guiding member 40. Therefore, the light 100 can be directed within the light guiding member 40 until the light 100 is irradiated to the reflecting member 50. When the light 100 irradiates towards the first reflecting surface 501, most of the light 100 is reflected around the light emitting chip 20. The light 100 emitted by the light emitting chip 20 forms a first reflection by the first reflecting surface 501, and the light 100 reflected by the first reflecting surface 501 passes through the light guiding member 40, so the light 100 may be transmitted towards the exterior of the package 10.

In an alternative exemplary embodiment, the package 10 further includes a substrate 60. The substrate 60 defines a second reflecting surface 61 faced towards the first reflecting surface 501 of the reflecting member 50. The light emitting chip 20, the color converting layer 30, and the light guiding member 40 are arranged on the second reflecting surface 61 of the substrate 60. The light 100 reflected by the first reflecting surface 501 irradiates towards the second reflecting surface 61 of the substrate 60. The light 100 emitted by the light emitting chip 20 forms a second reflection by the second reflecting surface 61 after the light 100 reflected by the first reflecting surface 501, so the illuminating range of the light 100 can be enlarged.

In the exemplary embodiment, the light emitting diode assembly structure 1 includes the light guiding member 40, the reflecting member 50 with the first reflecting surface 501, and the substrate 60 with a second reflecting surface 61. The light guiding member 40 is formed on the exterior of the light emitting chip 20 and the color converting layer 30. Therefore, the light 100 emitted by the light emitting chip 20 enters into the light guiding member 40. The light guiding member 40 directs the light 100 to irradiate towards the first reflecting surface 501 of the reflecting member 50. Thus, the light 100 emitted by the light emitting chip 20 forms the first reflection by the first reflecting surface 501, and the light 100 reflected by the first reflecting surface 501 irradiates towards the exterior of the light emitting chip 20. Furthermore, when the light 100 passes through the light guiding member 40, the light 100 may be transmitted further according to a material property of the light guiding member 40. Thus, a reflected angle range of the light 100 reflected by the reflecting member 50 can be enlarged, to facilitate a larger illuminating range.

In order to enlarge the illuminating range of the light 100 emitted by the light emitting chip 20, the light emitting chip 20 is arranged on the second reflecting surface 61 of the substrate 60. The light 100 reflected by the first reflecting surface 501 of the reflecting member 50 may irradiate towards the second reflecting surface 61 of the substrate 60. The light 100 emitted by the light emitting chip 20 forms the second reflection by the second reflecting surface 61, so the illuminating range of the light 100 is wider than the light directly emitted by a light emitting chip. Light emitted by a light emitting chip of existing art is subjected to only one reflection.

As shown in FIG. 2A to FIG. 2D, a light emitting diode assembly structure 1 includes a package 10 and a light emitting chip 20 encapsulated by the package 10. The package 10 includes a color converting layer 30, a light guiding member 40 and a reflecting member 50. The light emitting chip 20, the color converting layer 30, the light guiding member 40 and the reflecting member 50 are consistent features among the structures of the first exemplary embodiment. The difference in a first mode according to the first exemplary embodiment is that the reflecting member 50 defines a reflecting surface 501 different from the first exemplary embodiment, and a top surface of the light guiding member 40 defines a structure according to the reflecting surface 501. The reflecting surface 501 faces toward the light emitting chip 20. The reflecting surface 501 may be a surface selected from the group consisting of a planar, a concave, a convex, a parabolic, a multi-segmented, a curved surface, and a combination thereof. The reflecting surface 501 may be symmetrical or asymmetrical under all rotations about its center.

Figure 2A:
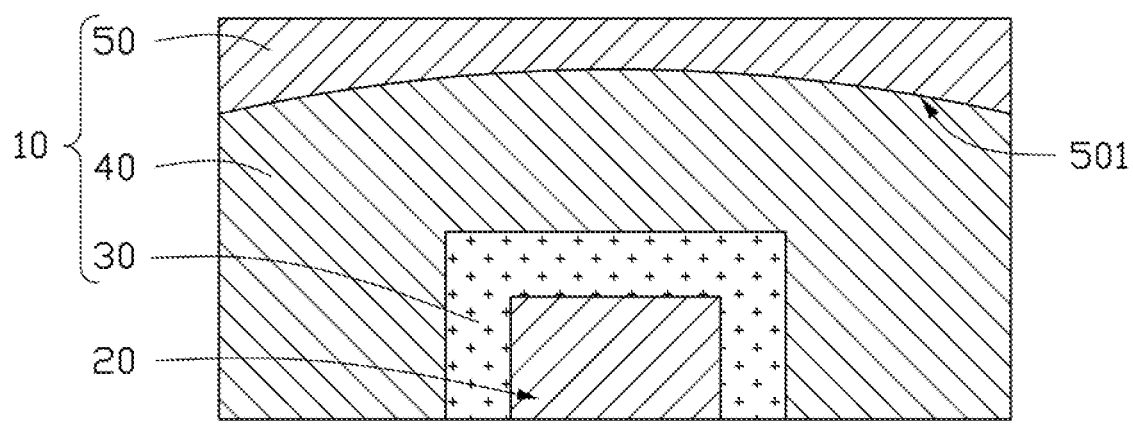
FIG. 2A is a schematic view of the reflecting member in a first mode according to the first exemplary embodiment.

As shown in FIG. 2A, in a first mode according to the first exemplary embodiment, the light guiding member 40 includes a convex structure adjacent to the reflecting surface 501 of the reflecting member 50, and the reflecting surface 501 of the reflecting member 50 includes a concave structure. The concave structure of the reflecting surface 501 faces toward the light emitting chip 20. The reflecting surface 501 of the reflecting member 50 is symmetrical under all rotations about its center. The light emitted by the light emitting chip 20 is reflected by the concave structure of the reflecting surface 501. The light may irradiate within the package 10, so concentrating the light and making it brighter.

Figure 2B:
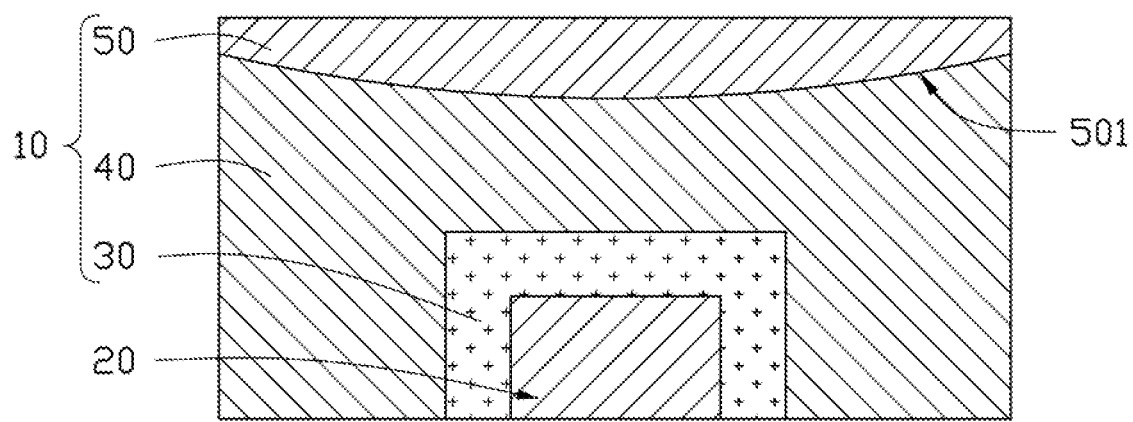
FIG. 2B is a schematic view of the reflecting member in a second mode according to the first exemplary embodiment.

As shown in FIG. 2B, in a second mode according to the first exemplary embodiment, the light guiding member 40 includes a concave structure adjacent to the reflecting surface 501 of the reflecting member 50, and the reflecting surface 501 of the reflecting member 50 includes a convex structure. The convex structure of the reflecting surface 501 faces toward the light emitting chip 20. The reflecting surface 501 of the reflecting member 50 is symmetrical under all rotations about its center. The light emitted by the light emitting chip 20 is reflected by the concave structure of the reflecting surface 501, so the light may travel toward the exterior of the package 10, to facilitate a wider illumination range.

Figure 2C:
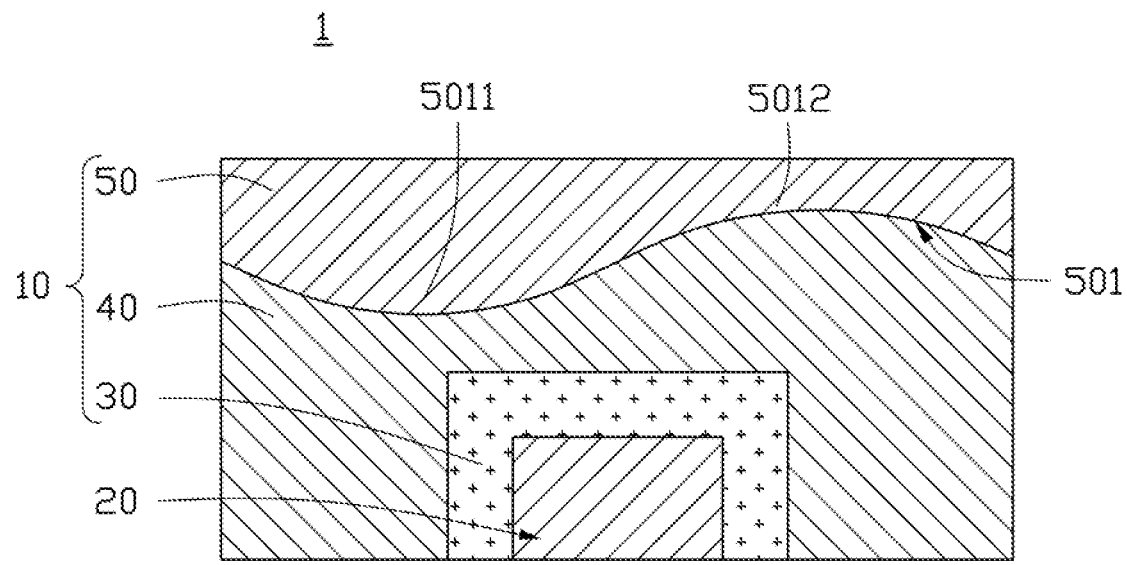
FIG. 2C is a schematic view of the reflecting member in a third mode according to the first exemplary embodiment.

As shown in FIG. 2C, in a third mode according to the first exemplary embodiment, one side of the light guiding member 40 includes a first concave structure and the other side of the light guiding member 40 includes a first convex structure. The first concave structure and the first convex structure cooperatively form a top surface of the light guiding member 40. The reflecting surface 501 of the reflecting member 50 is asymmetrical. The reflecting surface 501 includes a first side and a second side. The first side of the reflecting surface 501 includes a second convex structure and the second side of the reflecting surface 501 includes a second concave structure. The second concave structure of the reflecting surface 501 and the second convex structure of the reflecting surface 501 cooperatively form the reflecting surface 501. The reflecting surface 501 is substantially S-shaped. The second concave structure and the second convex structure of the reflecting surface 501 face toward the light emitting chip 20. The light emitted by the light emitting chip 20 is reflected by the second concave structure of the reflecting surface 501. The light irradiating the second convex structure of the reflecting surface 501 is reflected toward the exterior of the package 10, to facilitate the wider illumination range. The light irradiating the second concave structure of the reflecting surface 501 is reflected toward the inside of the package 10, so concentrating the light and making it brighter.

Figure 2D:
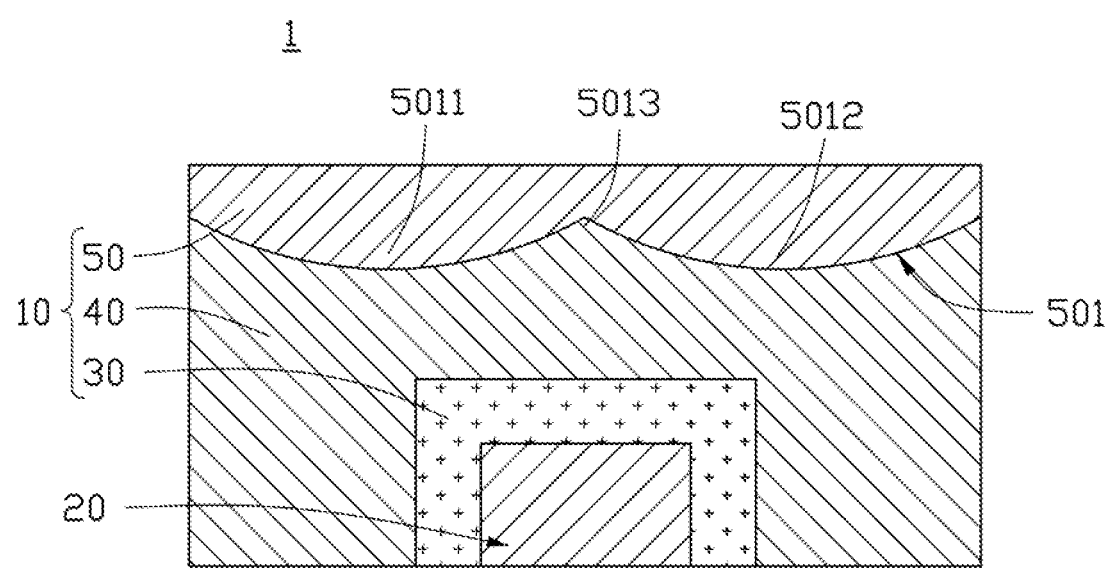
FIG. 2D is a schematic view of the reflecting member in a fourth mode according to the first exemplary embodiment.

As shown in FIG. 2D, in a fourth mode according to the first exemplary embodiment, one side of the light guiding member 40 includes a first convex structure and the other side of the light guiding member 40 includes a second convex structure symmetrical in the first convex structure. The first convex structure and the second convex structure cooperatively form a top surface of the light guiding member 40. The reflecting surface 501 of the reflecting member 50 is symmetrical under all rotations about its center. The reflecting surface 501 includes a first side and a second side. The first side of the reflecting surface 501 includes a first concave structure 5011 and the second side of the reflecting surface 501 includes a second concave structure 5012. The first concave structure 5011 of the reflecting surface 501 and the second convex structure 5012 of the reflecting surface 501 cooperatively form the reflecting surface 501. A third convex structure 5013 is formed between the first concave structure and the second concave structure of the reflecting surface 501. The third convex structure 5013 faces toward the light emitting chip 20. The light emitted by the light emitting chip 20 is reflected by the concave structure of the reflecting surface 501. The light irradiating the first and second convex structures of the reflecting surface 501 is reflected toward the exterior of the package 10, to widen the illumination range. The light irradiating the third convex structure 5013 of the reflecting surface 501 is reflected towards the inside of the package 10, to make the light brighter.

Figure 3:
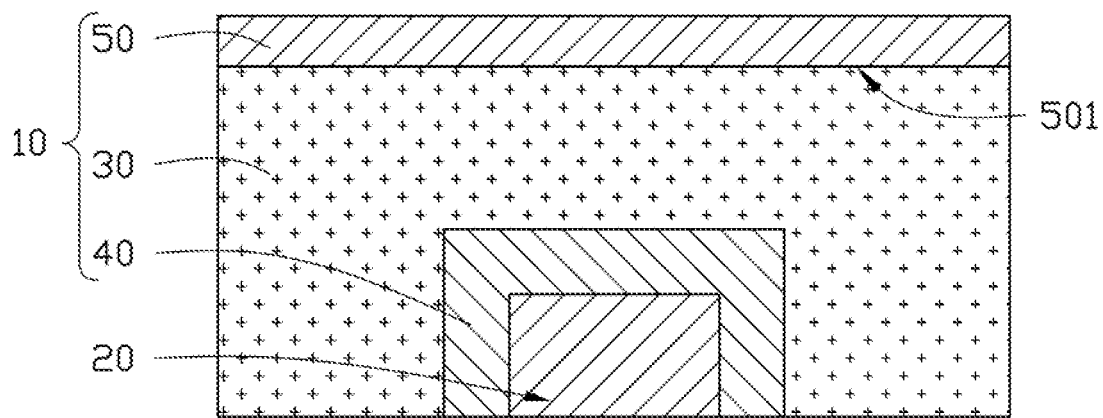
FIG. 3 is a schematic view of a light emitting diode assembly structure according to a second exemplary embodiment.

As shown in FIG. 3, in a second exemplary embodiment, a light emitting diode assembly structure 2 includes a package 10 and a light emitting chip 20 encapsulated by the package 10. The package 10 includes a color converting layer 30, a light guiding member 40 and a reflecting member 50. The light emitting chip 20, the color converting layer 30, the light guiding member 40, and the reflecting member 50 are substantially consistent features among the structures of the first exemplary embodiment. The difference is that the light emitting chip 20 is coated by the light guiding member 40, the light guiding member 40 is coated by the color converting layer 30, and the reflecting member 50 is arranged above the color converting layer 30.

The light emitting chip 20 may be a chip selected from the group consisting of a horizontal type light emitting diode chip, a vertical type light emitting diode chip, a flip chip type light emitting diode chip, and a combination thereof. A user may select or change any one of these. The reflecting member 50 may change according to the first exemplary embodiment in the above modes or a combination thereof. The reflecting surface 501 may be a surface selected from the group consisting of a planar, a concave, a convex, a parabolic, a multi-segmented, a curved surface, and a combination thereof. The reflecting surface 501 may be symmetrical or asymmetrical under all rotations about its center.

Figure 4:
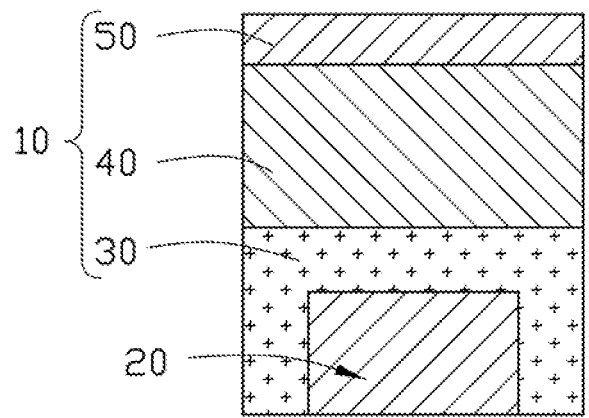
FIG. 4 is a schematic view of a light emitting diode assembly structure according to a third exemplary embodiment.

As shown in FIG. 4, in a third exemplary embodiment, a light emitting diode assembly structure 3 includes a package 10 and a light emitting chip 20=encapsulated by the package 10. The package 10 includes a color converting layer 30, a light guiding member 40 and a reflecting member 50. The light emitting chip 20, the color converting layer 30, the light guiding member 40 and the reflecting member 50 are substantially consistent features among the structures of the first exemplary embodiment. The difference is that the color converting layer 30 is not coated by the light guiding member 40, and the light guiding member 40 is arranged above the color converting layer 30 and faced towards the light emitting chip 20.

The light emitting chip 20 may be selected from the group consisting of a horizontal type light emitting diode chip, a vertical type light emitting diode chip, a flip chip type light emitting diode chip, and a combination thereof. The reflecting member 50 may change according to the first exemplary embodiment in the above modes or a combination thereof. The reflecting surface 501 may be a surface selected from the group consisting of a planar, a concave, a convex, a parabolic, a multi-segmented, a curved surface, and a combination thereof. The reflecting surface 501 may be symmetrical or asymmetrical under all rotations about its center.

Figure 5:
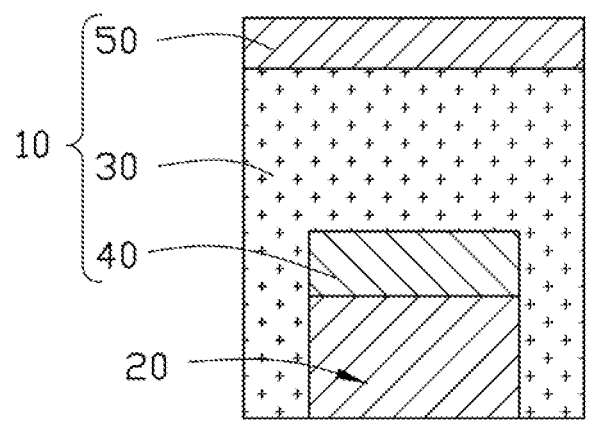
FIG. 5 is a schematic view of a light emitting diode assembly structure according to a fourth exemplary embodiment.

As shown in FIG. 5, in a fourth exemplary embodiment, a light emitting diode assembly structure 4 includes a package 10 and a light emitting chip 20 encapsulated by the package 10. The package 10 includes a color converting layer 30, a light guiding member 40, and a reflecting member 50. The light emitting chip 20, the color converting layer 30, the light guiding member 40 and the reflecting member 50 are substantially consistent features among the structures of the first exemplary embodiment. The difference is that the light guiding member 40 is arranged above the light emitting chip 20 and is coated by the color converting layer 30, and the reflecting member 50 is arranged above the color converting layer 30.

The light emitting chip 20 may be selected from the group consisting of a horizontal type light emitting diode chip, a vertical type light emitting diode chip, a flip chip type light emitting diode chip, and a combination thereof. The reflecting member 50 is applicable to the reflecting member 50 according to the first exemplary embodiment in the above modes or a combination thereof. The reflecting surface 501 may be a surface selected from the group consisting of a planar, a concave, a convex, a parabolic, a multi-segmented, a curved surface, and a combination thereof. The reflecting surface 501 may be symmetrical or asymmetrical under all rotations about its center.

As shown in FIG. 6A to FIG. 6D, in a fifth exemplary embodiment, a light emitting diode assembly structure 5 includes a package 10A and a light emitting chip 20A encapsulated by the package 10A. The package 10A includes a color converting layer 30A, a light guiding member 40A, and a reflecting member 50A. The light emitting chip 20A is coated by the color converting layer 30A. The light guiding member 40A is arranged around a periphery of the color converting layer 30A. The reflecting member 50A is arranged on an inner surface of the light guiding member 40A. The reflecting member 50A is arranged around a periphery of the light emitting chip 20A.

In order to improve illumination efficiency, a width of the cross-section of the reflecting member 50A increases gradually in a direction away from the light emitting chip 20A.

The reflecting member 50A includes a reflecting surface 501A facing to the light emitting chip 20A. The reflecting surface 501A and a lower surface of the light guiding member 40A form an angle α.

The angle α is an obtuse angle. That is, the angle α is substantially in a range of more than 90 degrees to less than 180 degrees. Thus, the light emitted by the light emitting chip 20A is irradiated onto the reflecting surface 501A, and then reflected toward an exterior of the package 10A.

The reflecting surface 501A may be planar or non-planar. A color of the reflecting surface 501A may be a weak or faint color, in order to enhance an emission rate of the light emitted by the light emitting chip 20A. The overall color of the reflecting surface 501A is preferably silver or white.

Figure 6A:
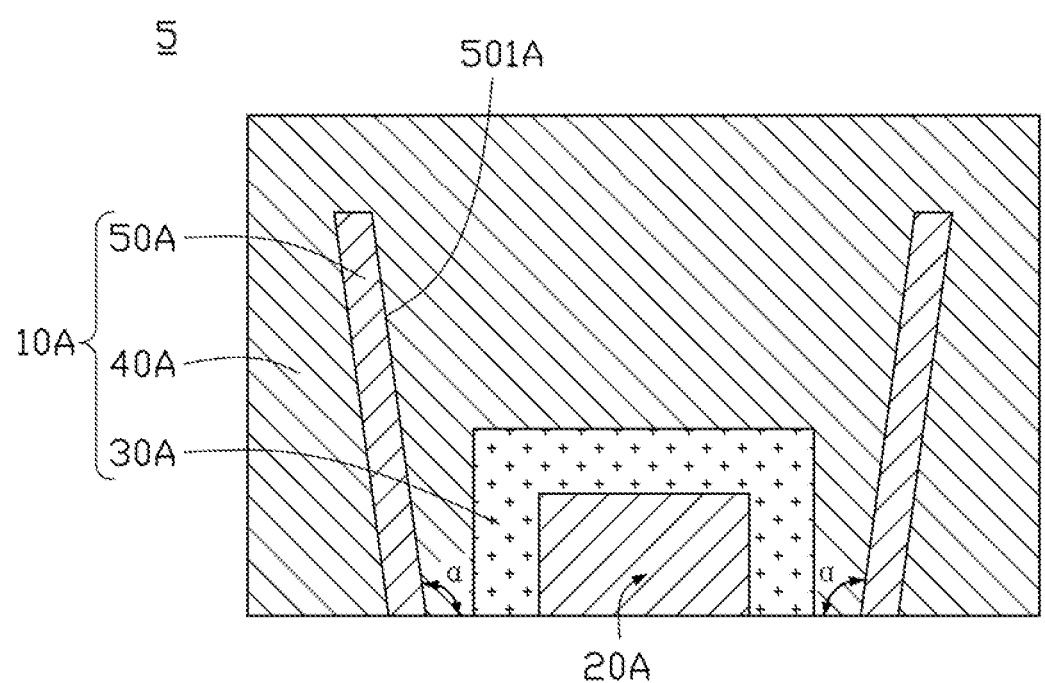
FIG. 6A is a schematic view of a light emitting diode assembly structure according to a fifth exemplary embodiment, the assembly including a reflecting member and a light guiding member.
Figure 6B:
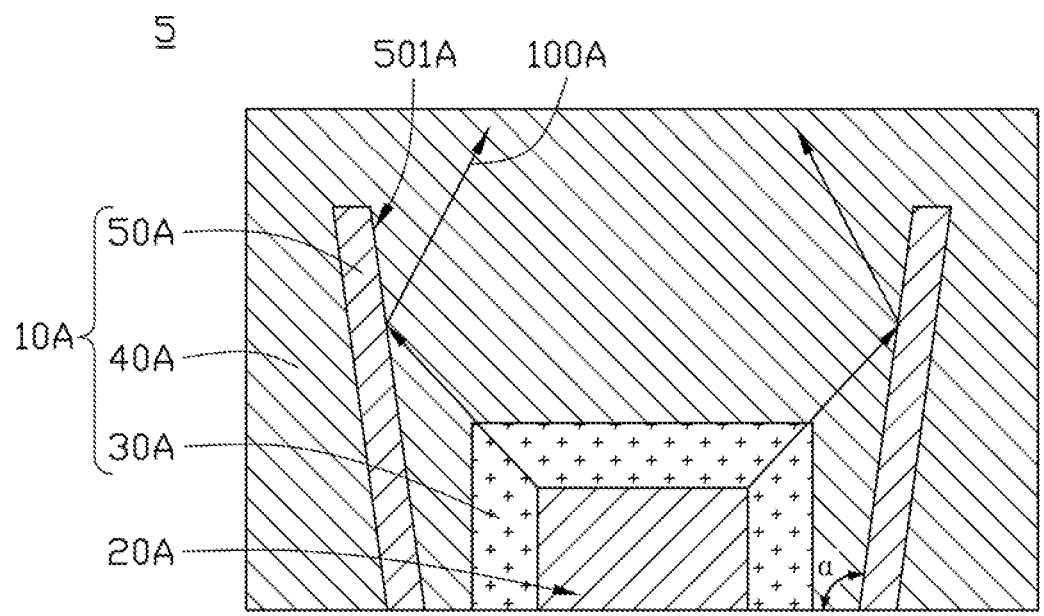
FIG. 6B is a schematic view of a light path of the light emitting diode assembly structure of the fifth exemplary embodiment.

As shown in FIG. 6B, the light emitting chip 20A emits a light 100A. The light 100A passes through the color converting layer 30A, which can change the color of the light 100A to a desired color. A portion of the light 100A is directly irradiated towards the exterior of the package body 10A, the other portion of the light 100A irradiates towards the reflecting surface 501A of the reflecting member 50A. The light is then reflected towards the exterior of the package 10A, so the irradiation range of the light 100A is enlarged, to facilitate external irradiation.

Figure 6C:
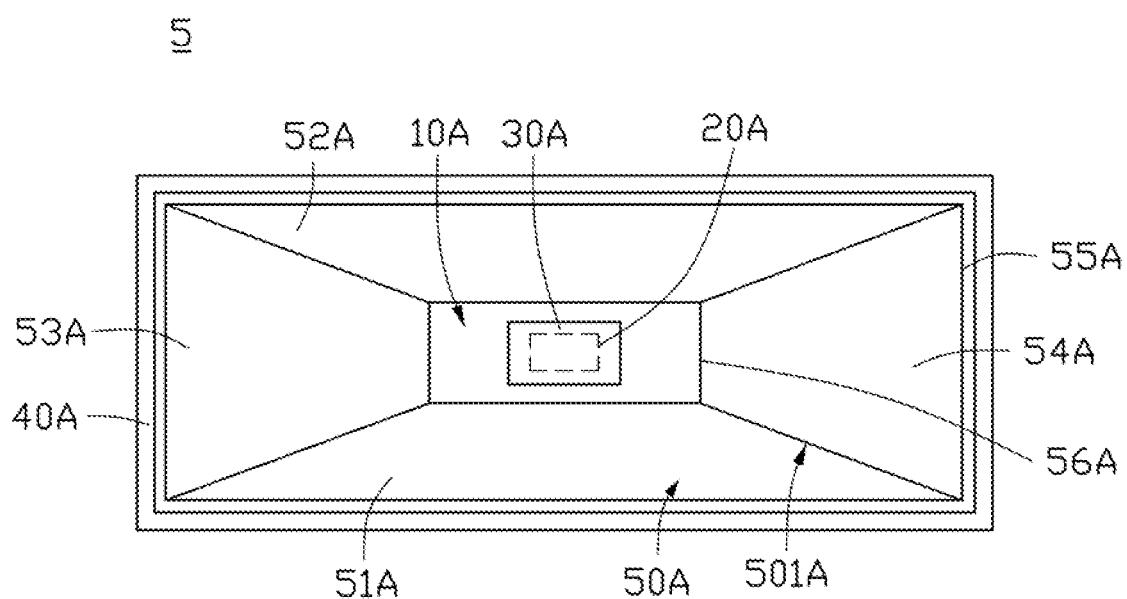
FIG. 6C is a schematic view of an angle in one mode of the fifth exemplary embodiment reflecting member.
Figure 6D:
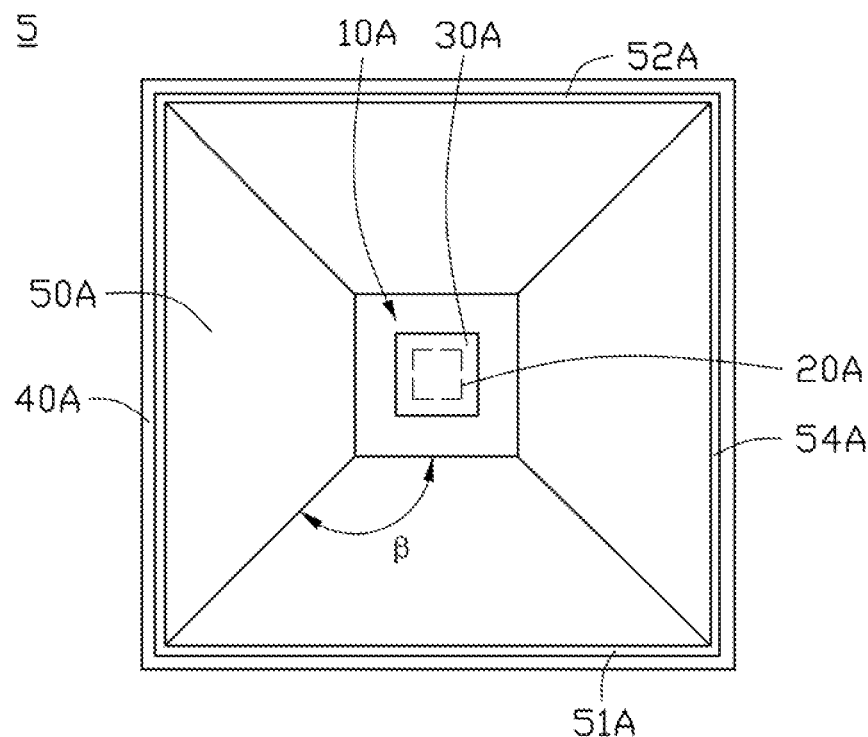
FIG. 6D is a schematic view of the angle in a second mode of the fifth exemplary embodiment reflecting member.

FIG. 6C and FIG. 6D are a top plan schematic view of light emitting diode assembly structure 5.

As shown in FIG. 6C, in a first mode according to the fifth exemplary embodiment, the reflecting member 50A includes a front panel 51A, a rear panel 52A, a first side panel 53A, and a second side panel 54A. The front panel 51A and the rear panel 52A may be symmetrical or asymmetrical. The first side panel 53A and the second side panel 54A may be symmetrical or asymmetrical. In the exemplary embodiment, the front panel 51A, the rear panel 52A, the first side panel 53A, and the second side panel 54A are separately constructed in a trapezoidal shape. The front panel 51A and the rear panel 52A are symmetrical, the first side panel 53A and the second side panel 54A are also symmetrical, and a size of the front panel 51A is different from a size of the first side panel 54A. The reflecting member 50A is substantially a frustum. Bottom and upper ends of the reflecting member 50A cooperatively form a rectangular shape. Each trapezoidal shape includes a wider upper part 55A and a narrower lower part 56A, to facilitate stronger irradiation of the reflecting surface 501A. An inner surface of the front panel M A, the rear panel 52A, the first side panel 53A, and the second side panel 54A cooperatively form the reflecting surface 501A. The reflecting surface 501A is a sealed and continuous structural surface, to facilitate greater external illumination.

In an alternative exemplary embodiment, the front panel 51A, the rear panel 52A, the first side panel 53A, and the second side panel 54A may be separately constructed and of any shape, to facilitate more irradiation of the reflecting surface 501A.

As shown in FIG. 6D, in the second mode according to the fifth exemplary embodiment, the reflecting member 50A is a substantially consistent feature among the structures of the first mode of FIG. 6C. The difference is that the front panel 51A, the rear panel 52A, the first side panel 53A, and the second side panel 54A have the same trapezoidal shape. In the exemplary embodiment, the trapezoidal shape is an isosceles trapezium. Bottom and upper ends of the reflecting member 50A cooperatively form a square shape. Each trapezoidal shape has a base angle adjacent to the light emitting chip 20A. The base angle can be adjusted according to particular application requirement, so the light emitted by the light emitting chip 20A may change its light path, for different emission angles. Therefore, the illuminating efficiency of the light may be improved.

The light emitting chip 20 may be selected from the group consisting of a horizontal type light emitting diode chip, a vertical type light emitting diode chip, a flip chip type light emitting diode chip, and a combination thereof.

Figure 7A:
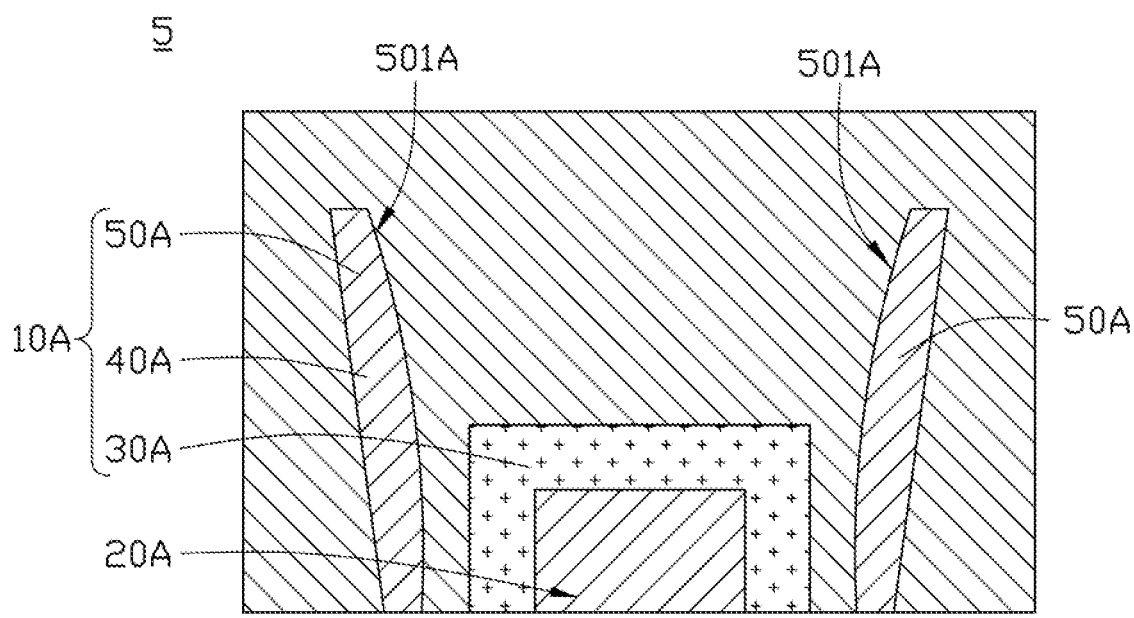
FIG. 7A is a schematic view of the reflecting member in a first mode according to the fifth exemplary embodiment.
Figure 7B:
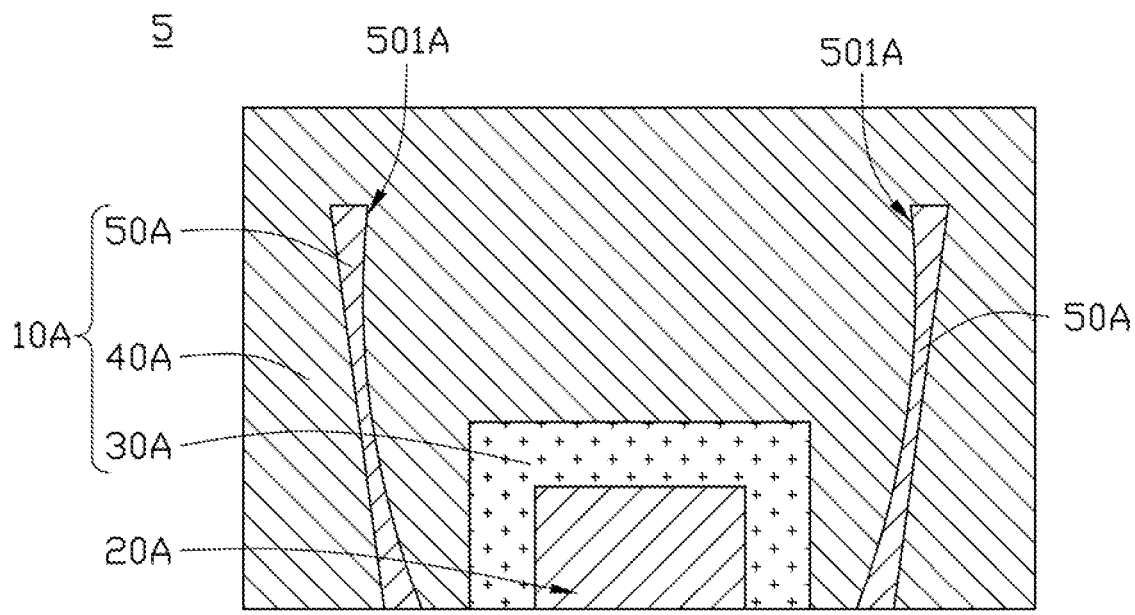
FIG. 7B is a schematic view of the reflecting member in a second mode according to the fifth exemplary embodiment.
Figure 7C:
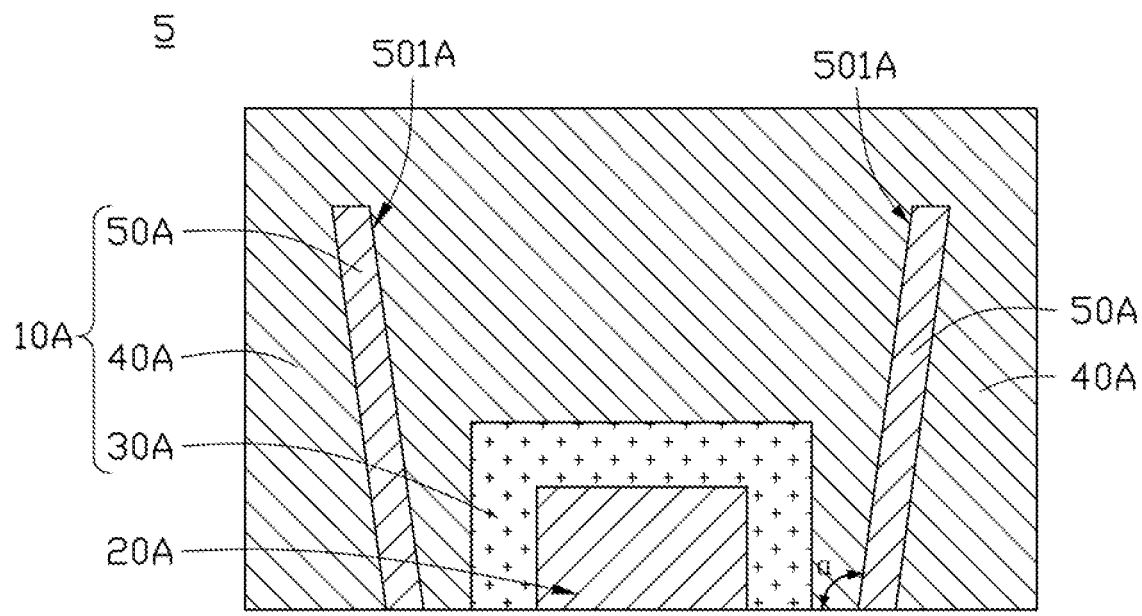
FIG. 7C is a schematic view of the reflecting member in a third mode according to the fifth exemplary embodiment.

As shown in FIG. 7A to FIG. 7C, the light emitting diode assembly structure 5 is a substantially consistent feature among the structures of the fifth exemplary embodiment. The difference is that the reflecting member 50A defines a different structure of the reflecting surface 501A. The reflecting surface 501A of the reflecting member 50A is arranged around the periphery of the light emitting chip 20. The reflecting surface 501A may be a surface selected from the group consisting of a planar, a concave, a convex, a parabolic, a multi-segmented, a curved surface, and a combination thereof. The reflecting surface 501 may be symmetrical or asymmetrical under all rotations about its center.

In an alternative exemplary embodiment, the configuration of the reflecting surface 501A can be changed according to particular application requirement, so the structure of the reflecting surface 501A is not limited to that of the above exemplary embodiment. In addition, the combined structure of the light guiding member 40A and the reflective member 50A is not limited to the fixed form structure shown in the above-described exemplary embodiment. The base angle β of each trapezoidal shape of the reflective member 50A can be adjusted according to particular application requirement.

As shown in FIG. 7A, in the first mode according to the fifth exemplary embodiment, the reflecting surface 501A of the reflective member 50A is a convex structure. The light emitted by the light emitting chip 20A is reflected by the reflecting surface 501A of the reflective member 50A. The light irradiating the convex structure of the reflecting surface 501A is reflected towards the exterior of the package 10A, to facilitate an enlarged irradiation range.

As shown in FIG. 7B, in the second mode according to the fifth exemplary embodiment, the reflecting surface 501A of the reflective member 50A is a concave structure. The light emitted by the light emitting chip 20A is reflected by the reflecting surface 501A of the reflective member 50A. The light irradiating the concave structure of the reflecting surface 501A is reflected toward the inside surface of the package 10A, so concentrating the light and making it brighter.

As shown in FIG. 7C, in the third mode according to the fifth exemplary embodiment, the reflecting surface 501A of the reflective member 50A is a plane. The reflecting surface 501A and the bottom surface of the light emitting chip 20A form an angle α facing the light emitting chip 20A. The angle α may be in a range of more than 90 degrees to less than 180 degrees. The light emitted by the light emitting chip 20A is reflected by the reflecting surface 501A of the reflective member 50A. When the angle α is less than 90 degrees, most of the light irradiating the reflecting surface 501A is reflected toward the inside surface of the package 10A, so concentrating the light and making it brighter. When the angle α is more than 90 degrees, most of the light irradiating the reflecting surface 501A is reflected towards the exterior of the package 10A for enlarging irradiation.

As shown in FIG. 8A to FIG. 8F, the light emitting diode assembly structure 5 has substantially consistent features among the structures of the fifth exemplary embodiment. The color converting layer 30A covers the light emitting chip 20A, and the reflection member 50A is arranged at the side of the color converting layer 30A. The light guiding member 40A covers the periphery of the color converting layer 30A and the reflective member 50A. The difference is that the light guiding member 40A defines different structures. The light guiding member 40A includes a light exiting surface 401A faced towards the light emitting chip 20A. The structure of the light exiting surface 401A may present a continuous surface or a discontinuous surface. The continuous and the discontinuous surface structures may be a plane surface, an arc surface, a n-shaped surface, and a v-shaped surface.

Figure 8A:
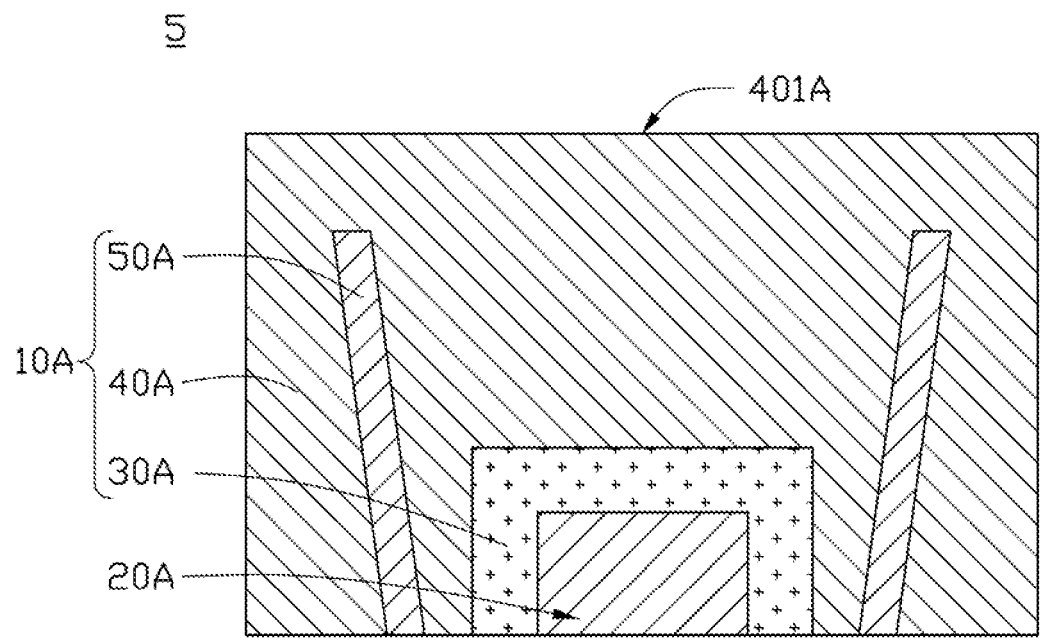
FIG. 8A is a schematic view of the light guiding member according to the fifth exemplary embodiment in first mode.
Figure 8B:
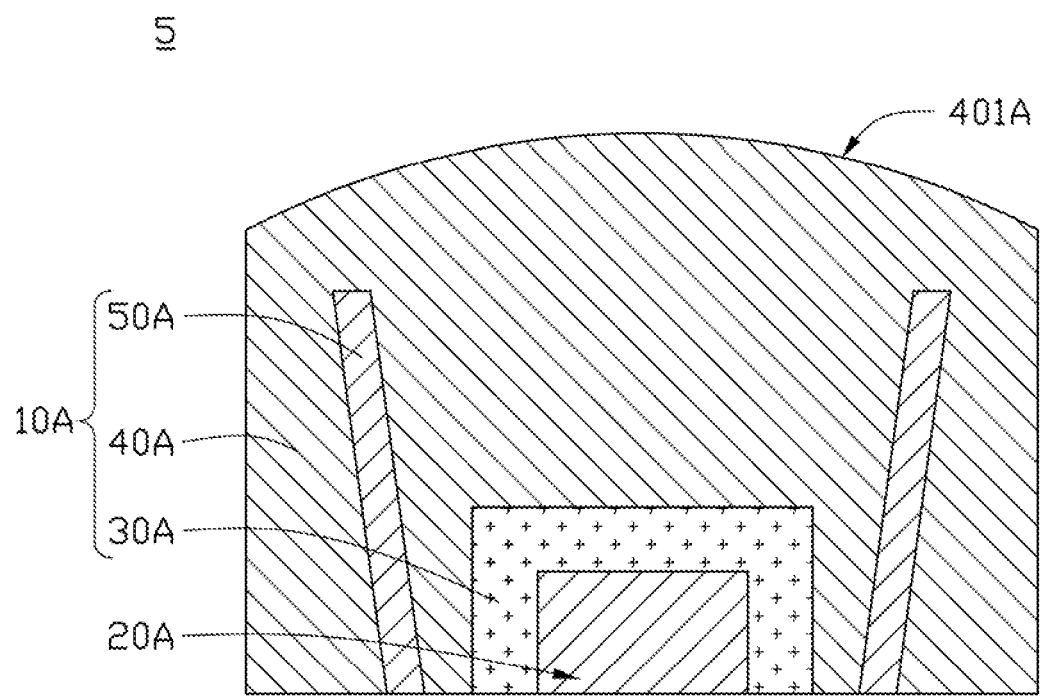
FIG. 8B is a schematic view of the fifth exemplary embodiment light guiding member in a second mode.
Figure 8C:
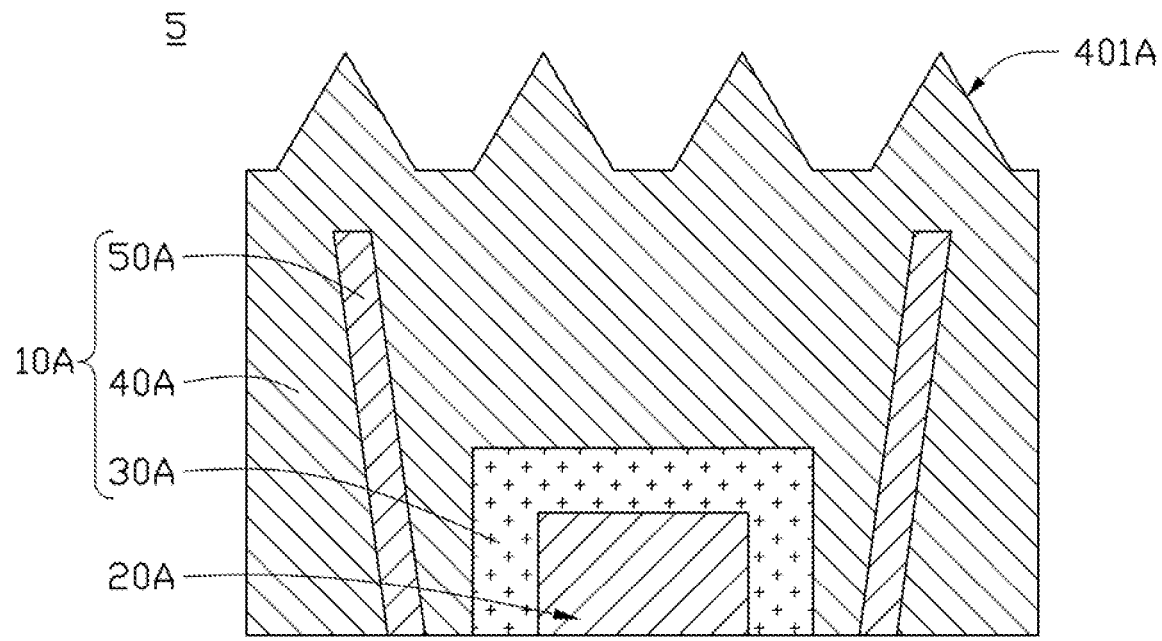
FIG. 8C is a schematic view of the fifth exemplary embodiment light guiding member in a third mode.
Figure 8D:
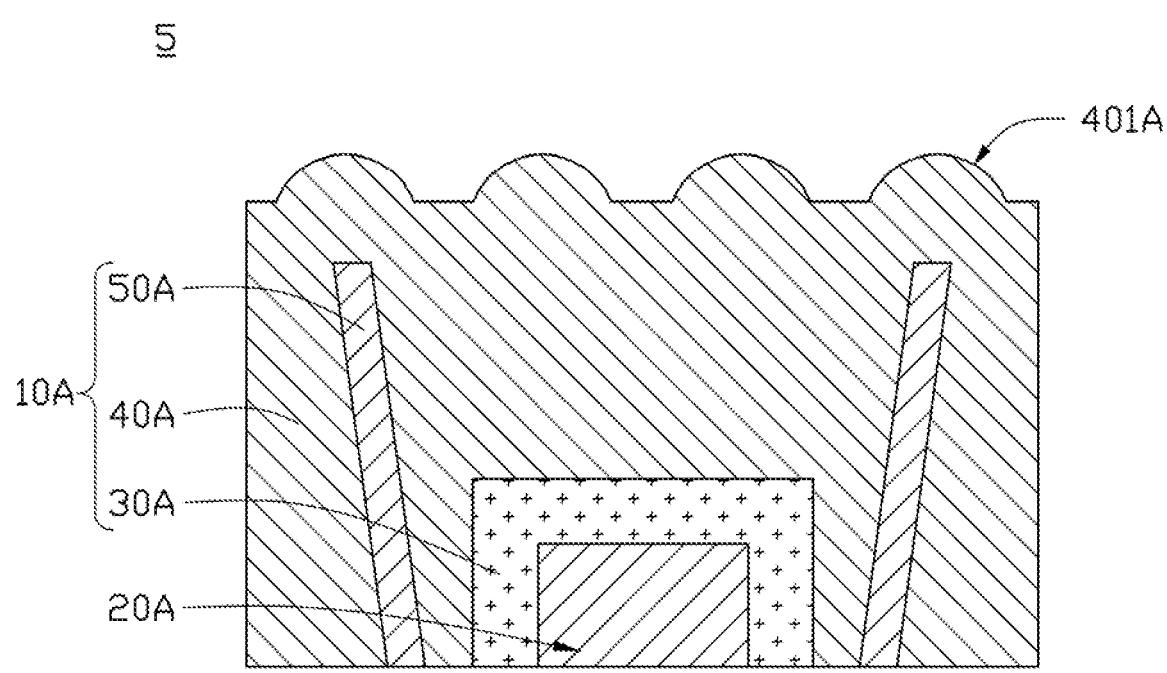
FIG. 8D is a schematic view of the fifth exemplary embodiment light guiding member in a fourth mode.
Figure 8E:
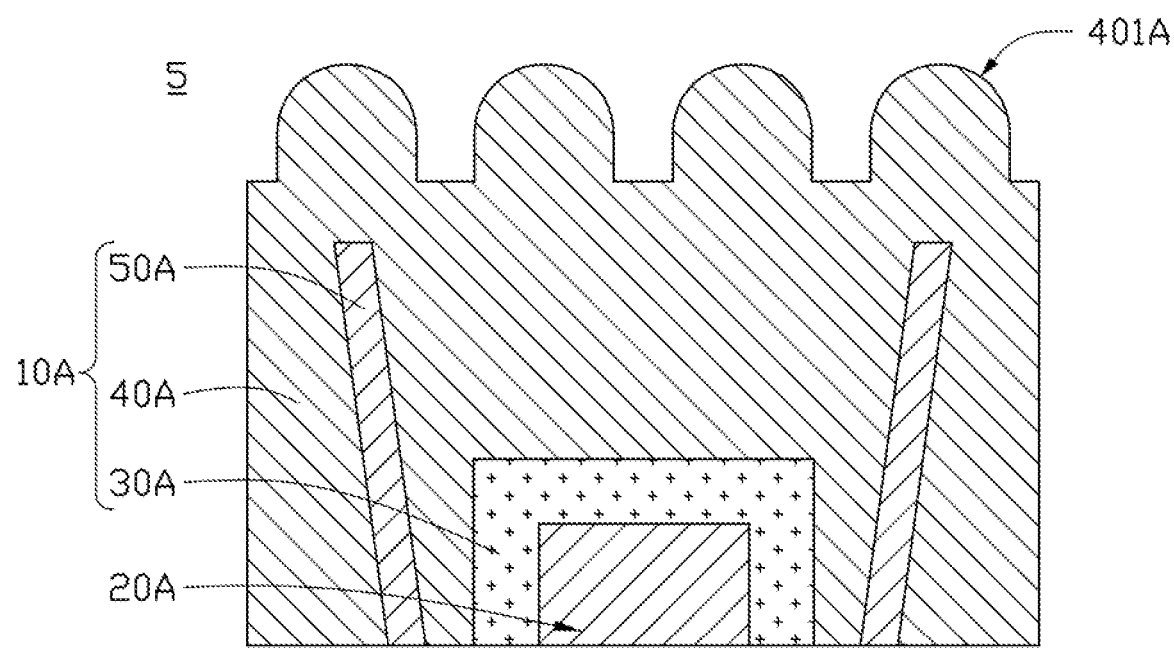
FIG. 8E is a schematic view of the fifth exemplary embodiment light guiding member in a fifth mode.
Figure 8F:
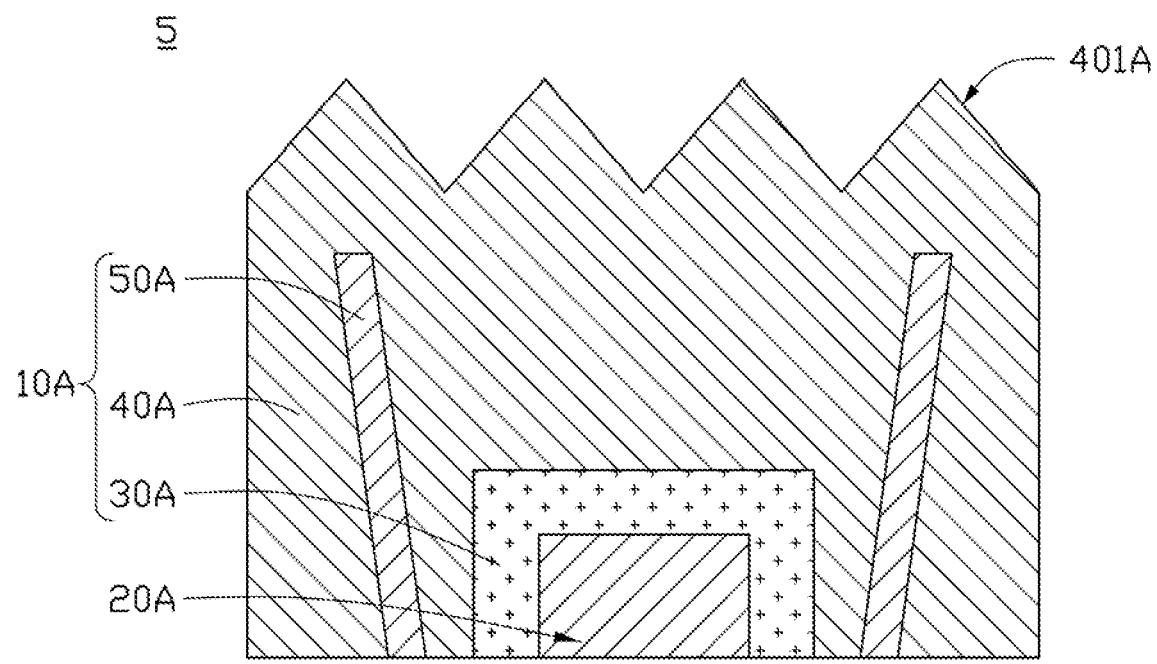
FIG. 8F is a schematic view of the fifth exemplary embodiment light guiding member in a sixth mode.

As shown in FIG. 8A, in a first mode according to the fifth exemplary embodiment, the light exiting surface 401A is a plane surface. As shown in FIG. 8B, in a second mode according to the fifth exemplary embodiment, the light exiting surface 401A is an arc surface. As shown in FIG. 8C, in a third mode according to the fifth exemplary embodiment, the light exiting surface 401A is a discontinuous and v-shaped groove surface. As shown in FIG. 8D, in a fourth mode according to the fifth exemplary embodiment, the light exiting surface 401A is a discontinuous and arced surface. As shown in FIG. 8E, in a fifth mode according to the fifth exemplary embodiment, the light exiting surface 401A is a discontinuous and n-shaped structure. As shown in FIG. 8F, in a sixth mode according to the fifth exemplary embodiment, the light exiting surface 401A is a continuous and v-shaped groove surface. The light exiting surface 401A defines the plane surface, the arc surface, the n-shaped surface, and the v-shaped groove surface, facilitating any desired changes to the path and pattern of the light emitted by the light emitting chip 20A.

Figure 9A:
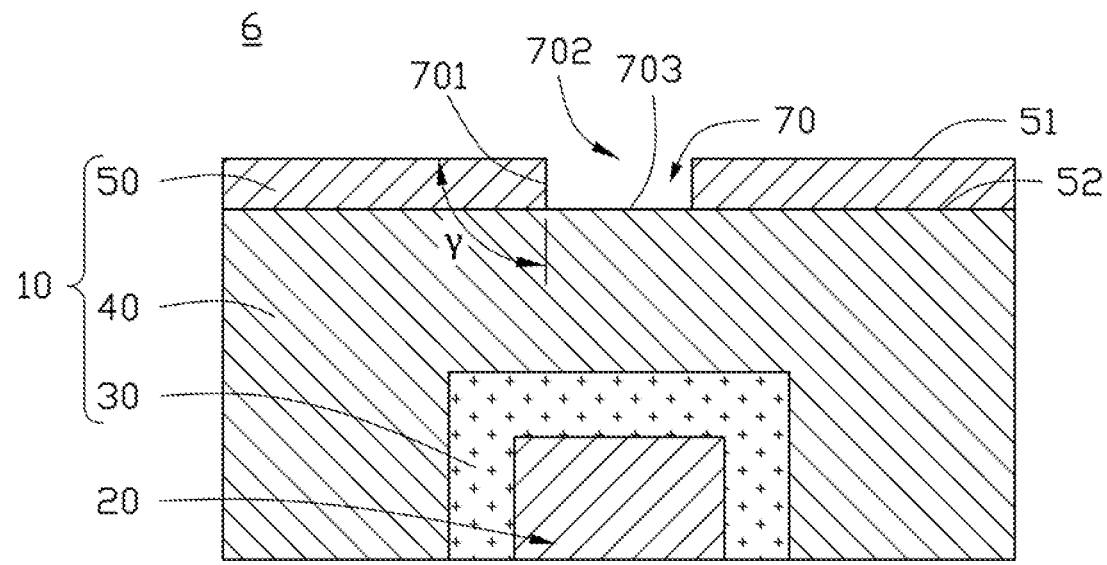
FIG. 9A is a schematic view of a light emitting diode assembly structure in a first mode according to a sixth exemplary embodiment, the assembly including a reflecting member, the light emitting diode assembly structure arranges a groove penetrating a first top and bottom surfaces of the reflecting member.
Figure 9B:
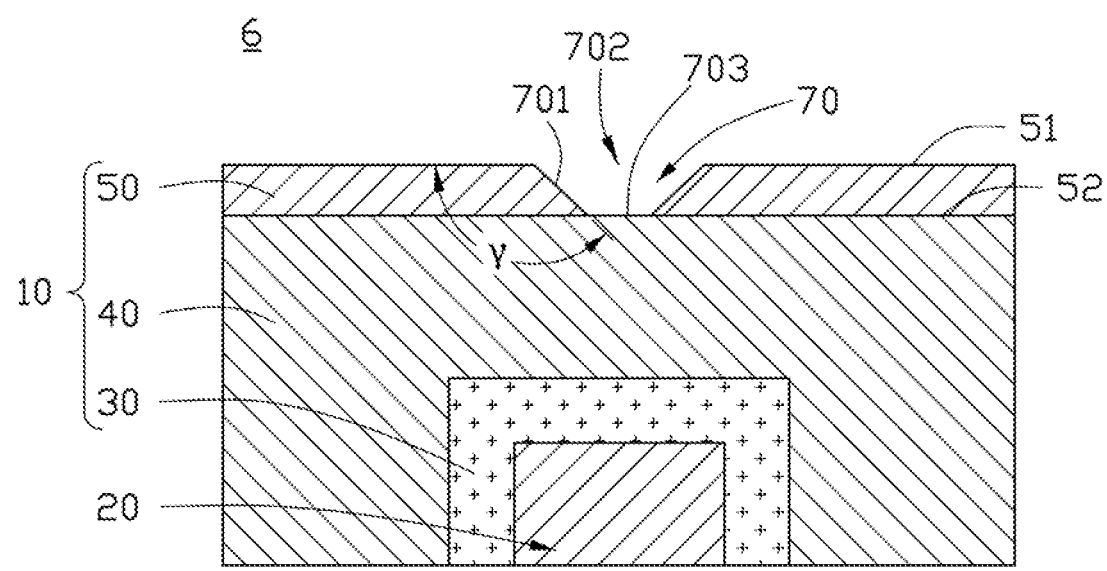
FIG. 9B is a schematic view of the light emitting diode assembly structure in a second mode according to the sixth exemplary embodiment.

As shown in FIG. 9A and FIG. 9B, in a sixth embodiment, a light emitting diode assembly structure 6 is disclosed herein. The light emitting diode assembly structure 6 is a substantially consistent feature among the structures of the first exemplary embodiment. The reflecting member 50 includes a top surface 51 opposite to the light guiding member 40 and a bottom surface 52 in contact with the light guiding member 40. The difference is that the light emitting diode assembly structure 6 arranges a groove 70 above the reflective chip 20, and the groove 70 penetrates the top and bottom surfaces 51, 52 of the reflecting member 50. Specifically, the groove 70 penetrates from the top surface 51 of the reflecting member 50 to the bottom surface 51 of the reflecting member 50.

It would therefore be understood that the groove 70 located over the light emitting chip 20, so the light emitted by the light emitting chip 20 can pass through the groove 70 to the exterior of the package 10 for enhancing irradiation, so the problem that a luminescence of the light emitting chip 20 is too dark is avoid, which is caused by the light exiting surface entirely configured as a reflective surface.

In order to ensure the light emitted by the light emitting chip 20 can be uniformly dispersed, the groove 70 may be substantially symmetrical under all rotations about its center. The groove 70 is configured as, but is not limited to, a cross-shaped groove or a circular groove. A width of the groove may be in a range from about 0.05 mm to 0.3 mm.

The top surface 51 of the reflecting member 50 is planar surface, and the bottom surface 52 of the reflecting member 50 is the reflecting surface 501. The top surface 51 of the reflecting member 50 is aligned with the bottom surface 52 of the reflecting member 50.

The groove 70 includes two opposing side walls 701. Each of the side walls 701 and the bottom surface 502 of the reflecting member 50 form an angle γ opposite to the groove 70. The angle γ is a range from 90 degrees to more than 180 degrees. When the reflecting surface 501 of the reflecting member 50 is the planar surface, the reflecting surface 501 is perpendicular to the side walls 701.

The groove 70 includes an upper end portion 702 opposite to the light guiding member 40 and a lower end portion 703 adjacent to the light guiding member 40. A width of the upper end portion 702 is more than or equal to a width of the lower end portion 703.

It would therefore be understood that a width of the cross-section of the groove 70 increases gradually in a direction away from the light emitting chip 20, to facilitate an enhancement of the irradiating efficiency of the light emitting chip 20.

The reflecting member 50 is applicable to the reflecting member 50 according to the first exemplary embodiment in the above modes or a combination thereof. The reflecting surface 501 may be a surface selected from the group consisting of a planar, a concave, a convex, a parabolic, a multi-segmented, a curved surface, and a combination thereof. The reflecting surface 501 may be symmetrical or asymmetrical under all rotations about its center.

As shown in FIG. 9A, in the embodiment, an angle γ forms between the side wall 701 and the bottom surface of the reflecting member 50 is 90 degrees. That is, the side wall 701 is perpendicular to the bottom surface 502. A width of the upper end portion 702 is equal to a width of the lower end portion 703. The cross-section of the groove 70 is configured as a rectangular shape or a cross-shaped structure.

As shown in FIG. 9B, in the embodiment, an angle γ forms between the side wall 701 and the bottom surface of the reflecting member 50 is more than 90 degrees. A width of the upper end portion 702 is lee than a width of the lower end portion 703. The cross-section of the groove 70 an inverted trapezoidal shape.

The inverted trapezoidal shape can be an isosceles trapezoid and a non-isosceles trapezoid shape.

Figure 10A:
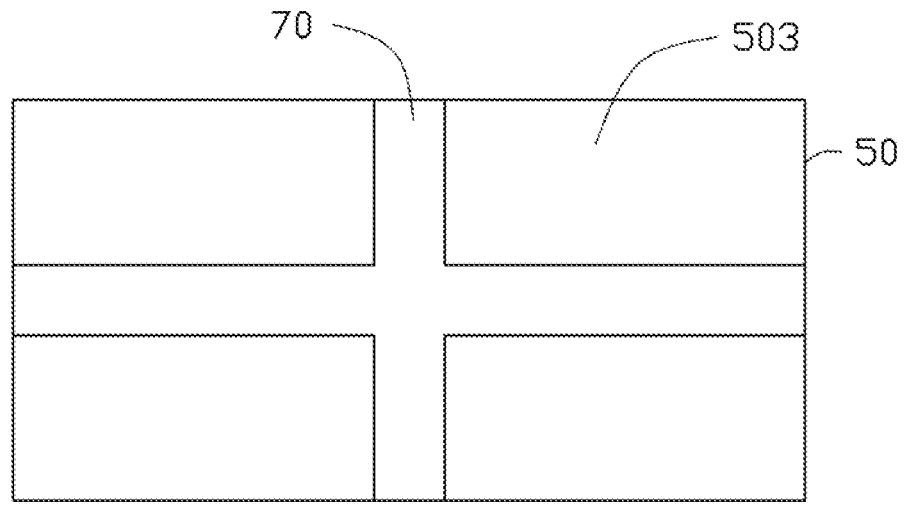
FIG. 10A is a top view of the light emitting diode assembly structure in one mode according to the sixth exemplary embodiment.

As shown in FIG. 10A, the groove 70 is the cross-shaped groove. The cross-shaped groove divides the reflecting member 50 into four reflecting regions 503 with a same size and symmetrical distribution, so the light emitted by the light emitting chip 20 can uniformly radiate to the surroundings of the package 10 through the reflecting regions 503. A junction of the cross-shaped groove is aligned with a center of the light emitting chip 20. Therefore, the light emitted by the light emitting chip 20 is partially irradiated to the exterior of the package 10 passed through the groove 70, to facilitate an improvement of the light emission luminance.

Figure 10B:
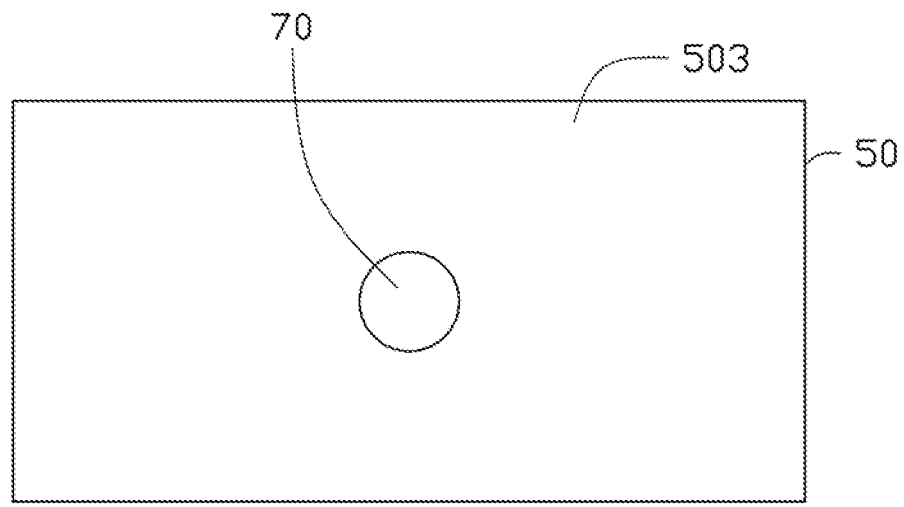
FIG. 10B is a top view of the light emitting diode assembly structure in another mode according to the sixth exemplary embodiment.

As shown in FIG. 10B, the groove 70 is a circular groove. The circular groove arranges above the light emitting chip 20. The circular groove arranges on a middle portion of the reflecting member 50. The reflecting member 50 includes a reflecting region 503. A diameter of the circular groove is in a range from 0.1 nm to 0.3 nm, so the light emitted by the light emitting chip 20 partially irradiated to the exterior of the package 10 passed through the groove 70, to facilitate an improvement of the light emission luminance.

Figure 11A:
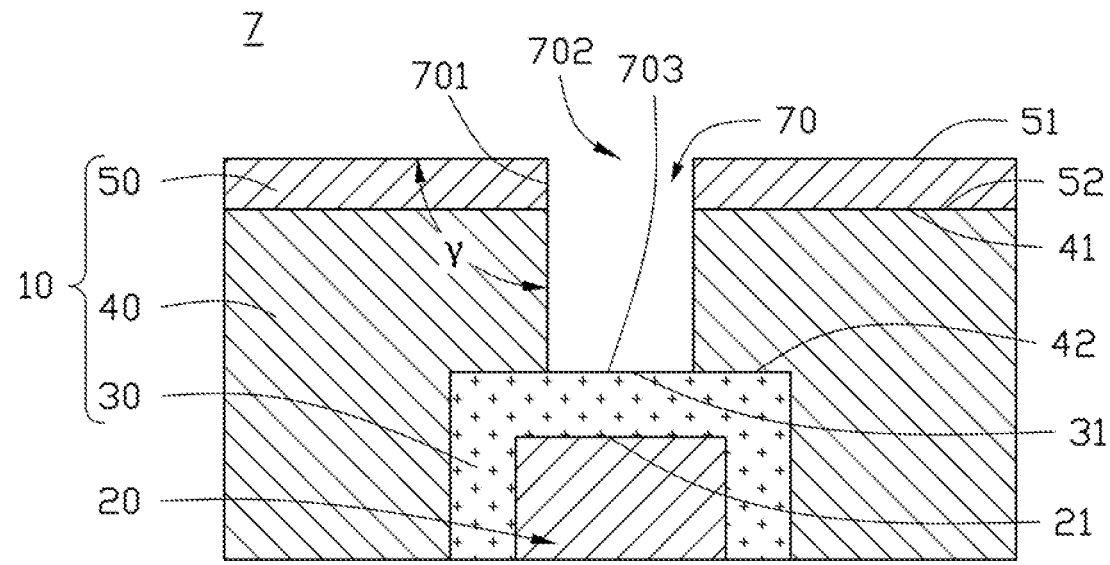
FIG. 11A is a schematic view of a light emitting diode assembly structure in a first mode according to a seventh exemplary embodiment, the assembly including a reflecting member and a light guiding member, the light emitting diode assembly structure arranges a groove penetrating a first top and bottom surfaces of the reflecting member and the light guiding member respectively.
Figure 11B:
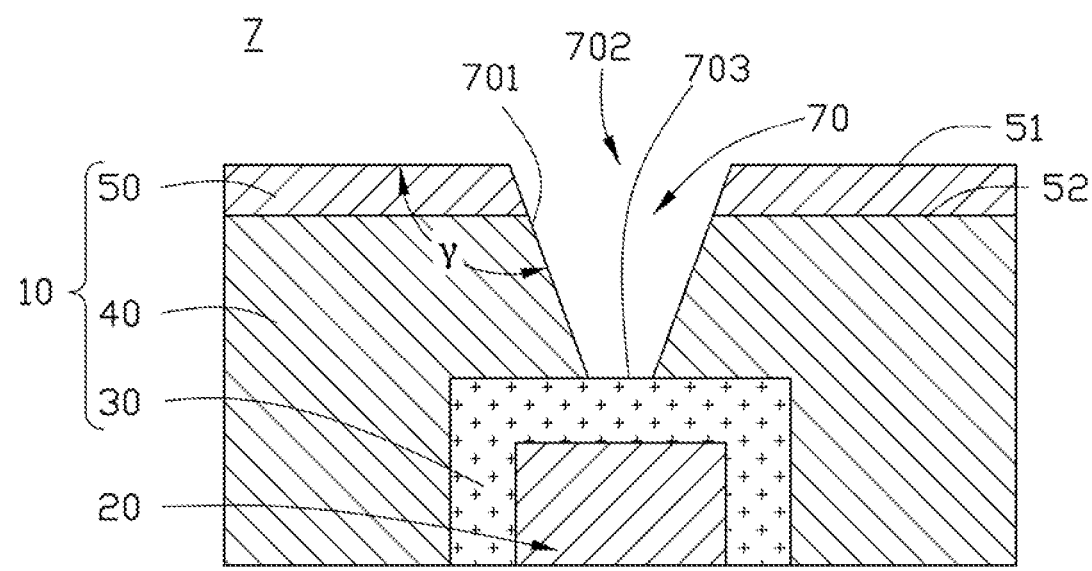
FIG. 11B is a schematic view of the light emitting diode assembly structure in a second mode according to the seventh exemplary embodiment.
Figure 12:
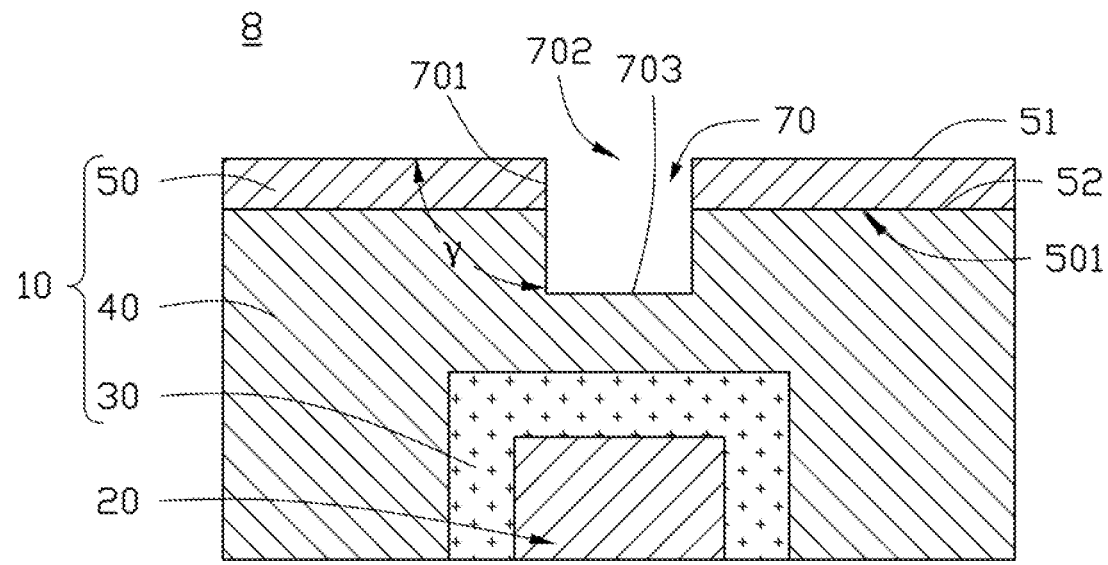
FIG. 12 is a schematic view of the light emitting diode assembly structure according to an eighth exemplary embodiment.

As shown in FIG. 11A and FIG. 11B, in a seventh embodiment, a light emitting diode assembly structure 7 is disclosed herein. The light emitting diode assembly structure 7 is a substantially consistent feature among the structures of the first exemplary embodiment. The light emitting chip 20 includes a top surface 21 in contact with the light color converting layer 30 and aligned with the reflecting surface 501 of the reflecting member 50. The light color converting layer 30 includes a top surface 31 in contact with the light guiding member 40 and aligned with the top surface 21 of the light emitting chip 20. The top surface 31 of the light color converting layer 30 is in opposite to the light emitting chip 20 and aligned with the reflecting surface 501 of the reflecting member 50. The light guiding member 40 includes a top surface 41 in contact with the reflecting member 50 and a bottom surface 42 in contact with the top surface 31 of the color converting layer 30. The reflecting member 50 includes a top surface 51 opposite to the light guiding member 40 and a bottom surface 52 in contact with the light guiding member 40. The difference is that the light emitting diode assembly structure 7 arranges a groove 70 above the reflective chip 20, and the groove 70 penetrates the top and bottom 51, 52 surfaces of the reflecting member 50 and the top and bottom surfaces 41, 42 of the light guiding member 40 respectively. Specifically, the groove 70 penetrates from the top surface 51 of the reflecting member 50 to the bottom surface 42 of the light guiding member 40.

The top surface 51 of the reflecting member 50 is planar surface, and the bottom surface 52 of the reflecting member 50 is the reflecting surface 501. The top surface 51 of the reflecting member 50 is aligned with the bottom surface 52 of the reflecting member 50.

The groove 70 includes two opposing side walls 701. Each of the side walls 701 and the bottom surface 502 of the reflecting member 50 form an angle γ opposite to the groove 70. The angle γ is in a range from 90 degrees to more than 180 degrees.

The groove 70 includes an upper end portion 702 opposite to the color converting layer 30 and a lower end portion 703 adjacent to the color converting layer 30. A width of the upper end portion 702 is more than or equal to a width of the lower end portion 703.

As shown in FIG. 11A, in a first mode, an angle γ forms between the side wall 701 and the bottom surface of the reflecting member 50 is 90 degrees. That is, the side wall 701 is perpendicular to the bottom surface 502. A width of the upper end portion 702 is equal to a width of the lower end portion 703. The cross-section of the groove 70 is a rectangular shape or a cross-shaped structure.

As shown in FIG. 11B, in a second mode, an angle γ forms between the side wall 701 and the bottom surface of the reflecting member 50 is more than 90 degrees. It would therefore be understood that a width of the cross-section of the groove 70 increases gradually in a direction away from the light emitting chip 20, to facilitate an enhancement of the irradiating efficiency of the light emitting chip 20. That is, a width of the upper end portion 702 is more than a width of the lower end portion 703. The cross-section of the groove 70 an inverted trapezoidal shape.

The inverted trapezoidal shape can be an isosceles trapezoid and a non-isosceles trapezoid shape.

The groove 70 is applicable to the reflecting member 50 according to the sixth exemplary embodiment in the above modes or a combination thereof. The groove 70 can be a cross-shaped groove or a circular groove. The features of the trench 70 are not described here.

The reflecting member 50 is applicable to the reflecting member 50 according to the first exemplary embodiment in the above modes or a combination thereof. The reflecting surface 501 may be a surface selected from the group consisting of a planar, a concave, a convex, a parabolic, a multi-segmented, a curved surface, and a combination thereof. The reflecting surface 501 may be symmetrical or asymmetrical under all rotations about its center.

Figure 13:
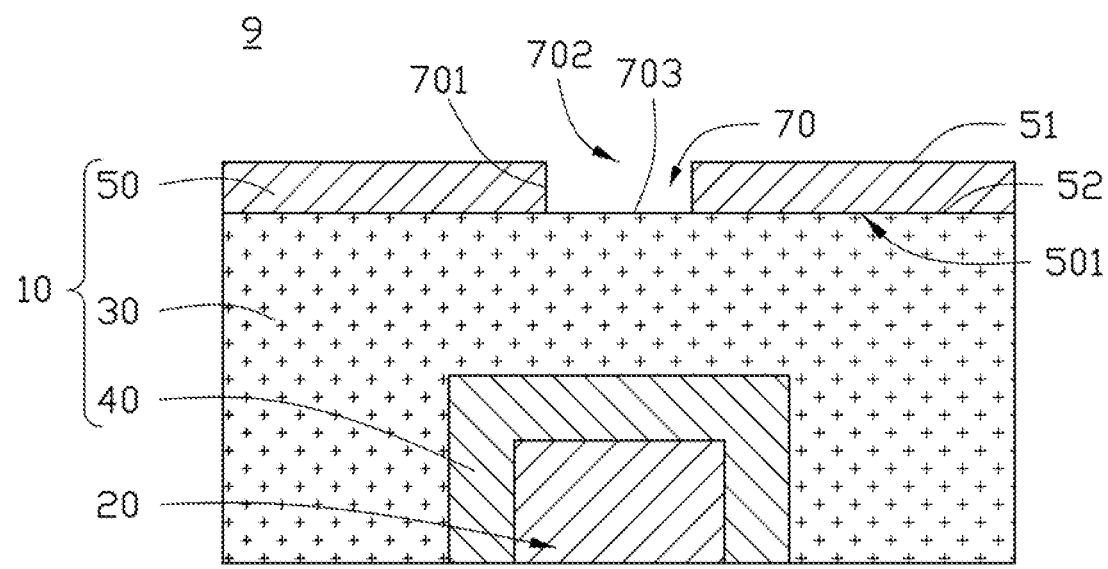
FIG. 13 is a schematic view of the light emitting diode assembly structure according to a ninth exemplary embodiment.

As shown in FIG. 13, in an eighth embodiment, a light emitting diode assembly structure 8 is disclosed herein. The light emitting diode assembly structure 8 is a substantially consistent feature among the structures of the first exemplary embodiment. The light emitting chip 20 includes a top surface 21 in contact with the light color converting layer 30 and aligned with the reflecting surface 501 of the reflecting member 50. The light color converting layer 30 includes a top surface 31 in contact with the light guiding member 40 and aligned with the top surface 21 of the light emitting chip 20. The top surface 31 of the light color converting layer 30 is in opposite to the light emitting chip 20 and aligned with the reflecting surface 501 of the reflecting member 50. The light guiding member 40 includes a top surface 41 in contact with the reflecting member 50 and a bottom surface 42 in contact with the top surface 31 of the color converting layer 30. The reflecting member 50 includes a top surface 51 opposite to the light guiding member 40 and a bottom surface 52 in contact with the light guiding member 40. The difference is that the light emitting diode assembly structure 8 arranges a groove 70 above the reflective chip 20, and the groove 70 penetrates the top and bottom 51, 52 surfaces of the reflecting member 50 and the top surface 41 of the light guiding member 40 respectively. Specifically, the groove 70 penetrates from the top surface 51 of the reflecting member 50 to the top surface 41 of the light guiding member 40.

The groove 70 may penetrate from the top surface 51 of the reflecting member 50 to a predetermined position between the top surface 41 of the light guiding member 40 and the bottom surface 42 of the light guiding member 40.

The groove 70 preferably penetrates from the top surface 51 of the reflecting member 50 to a middle position between the top surface 41 of the light guiding member 40 and the bottom surface 42 of the light guiding member 40.

The groove 70 is applicable to the reflecting member 50 according to the sixth exemplary embodiment in the above modes or a combination thereof. The groove 70 can be a cross-shaped groove or a circular groove. The features of the trench 70 are not described here.

The reflecting member 50 is applicable to the reflecting member 50 according to the first exemplary embodiment in the above modes or a combination thereof. The reflecting surface 501 may be a surface selected from the group consisting of a planar, a concave, a convex, a parabolic, a multi-segmented, a curved surface, and a combination thereof. The reflecting surface 501 may be symmetrical or asymmetrical under all rotations about its center.

As shown in FIG. 13, in a ninth embodiment, a light emitting diode assembly structure 9 is disclosed herein. The light emitting diode assembly structure 9 is a substantially consistent feature among the structures of the second exemplary embodiment. The reflecting member 50 includes a top surface 51 opposite to the light guiding member 40 and a bottom surface 52 in contact with the light guiding member 40. The difference is that the light emitting diode assembly structure 9 arranges a groove 70 above the reflective chip 20, and the groove 70 penetrates the top and bottom surfaces 51, 52 of the reflecting member 50. Specifically, the groove 70 penetrates from the top surface 51 of the reflecting member 50 to the bottom surface 51 of the reflecting member 50.

The groove 70 is applicable to the reflecting member 50 according to the sixth exemplary embodiment in the above modes or a combination thereof. The groove 70 can be a cross-shaped groove or a circular groove. The features of the trench 70 are not described here.

The reflecting member 50 is applicable to the reflecting member 50 according to the first exemplary embodiment in the above modes or a combination thereof. The reflecting surface 501 may be a surface selected from the group consisting of a planar, a concave, a convex, a parabolic, a multi-segmented, a curved surface, and a combination thereof. The reflecting surface 501 may be symmetrical or asymmetrical under all rotations about its center.

Figure 14:
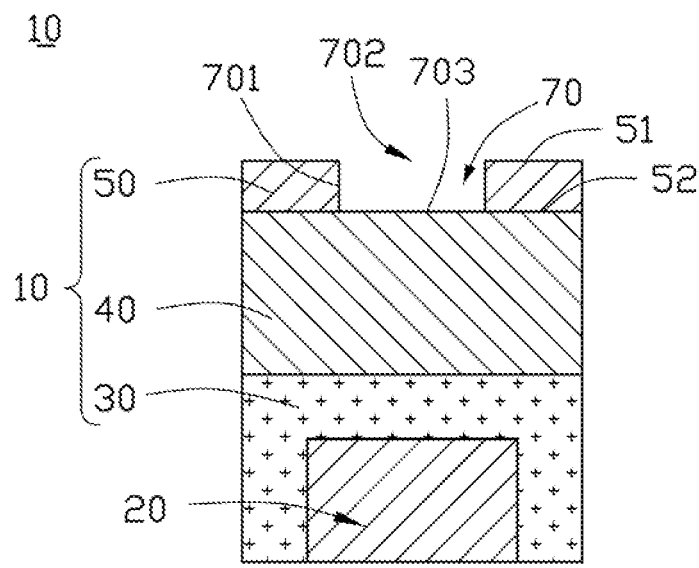
FIG. 14 is a schematic view of the light emitting diode assembly structure according to a tenth exemplary embodiment.

As shown in FIG. 14, in a tenth embodiment, a light emitting diode assembly structure 10 is disclosed herein. The light emitting diode assembly structure 10 is a substantially consistent feature among the structures of the third exemplary embodiment. The reflecting member 50 includes a top surface 51 opposite to the light guiding member 40 and a bottom surface 52 in contact with the light guiding member 40. The difference is that the light emitting diode assembly structure 10 arranges a groove 70 above the reflective chip 20, and the groove 70 penetrates the top and bottom surfaces 51, 52 of the reflecting member 50. Specifically, the groove 70 penetrates from the top surface 51 of the reflecting member 50 to the bottom surface 51 of the reflecting member 50.

The groove 70 is applicable to the reflecting member 50 according to the sixth exemplary embodiment in the above modes or a combination thereof. The groove 70 can be a cross-shaped groove or a circular groove. The features of the trench 70 are not described here.

The reflecting member 50 is applicable to the reflecting member 50 according to the first exemplary embodiment in the above modes or a combination thereof. The reflecting surface 501 may be a surface selected from the group consisting of a planar, a concave, a convex, a parabolic, a multi-segmented, a curved surface, and a combination thereof. The reflecting surface 501 may be symmetrical or asymmetrical under all rotations about its center.

Figure 15:
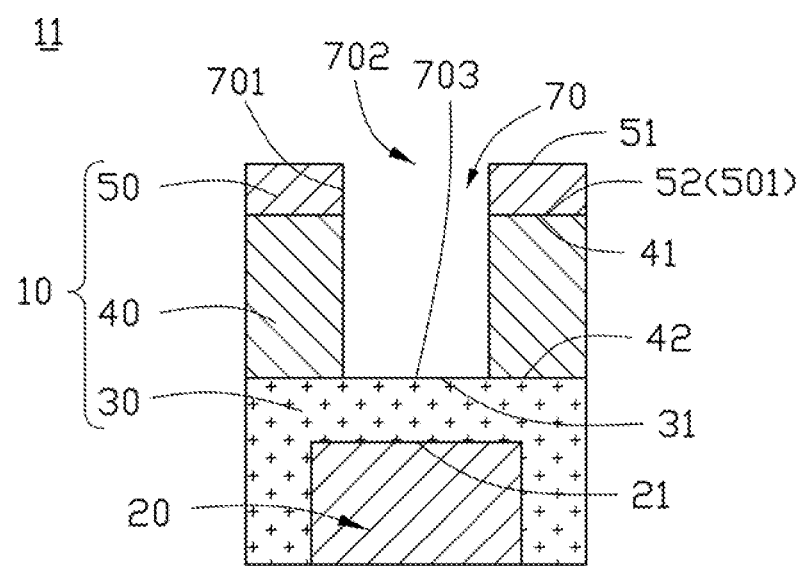
FIG. 15 is a schematic view of the light emitting diode assembly structure according to an eleventh exemplary embodiment.

As shown in FIG. 15, in an eleventh embodiment, a light emitting diode assembly structure 11 is disclosed herein. The light emitting diode assembly structure 11 is a substantially consistent feature among the structures of the third exemplary embodiment. The light emitting chip 20 includes a top surface 21 in contact with the light color converting layer 30 and aligned with the reflecting surface 501 of the reflecting member 50. The light color converting layer 30 includes a top surface 31 in contact with the light guiding member 40 and aligned with the top surface 21 of the light emitting chip 20. The top surface 31 of the light color converting layer 30 is in opposite to the light emitting chip 20 and aligned with the reflecting surface 501 of the reflecting member 50. The light guiding member 40 includes a top surface 41 in contact with the reflecting member 50 and a bottom surface 42 in contact with the top surface 31 of the color converting layer 30. The reflecting member 50 includes a top surface 51 opposite to the light guiding member 40 and a bottom surface 52 in contact with the light guiding member 40. The difference is that the light emitting diode assembly structure 11 arranges a groove 70, which penetrates the top and bottom surfaces 51, 52 of the reflecting member 50 and the top and bottom surfaces 41, 42 of the light guiding member 40 respectively. Specifically, the groove 70 penetrates from the top surface 51 of the reflecting member 50 to the bottom surface 42 of the light guiding member 40.

The groove 70 is applicable to the reflecting member 50 according to the sixth exemplary embodiment in the above modes or a combination thereof. The groove 70 can be a cross-shaped groove or a circular groove. The features of the trench 70 are not described here.

The reflecting member 50 is applicable to the reflecting member 50 according to the first exemplary embodiment in the above modes or a combination thereof. The reflecting surface 501 may be a surface selected from the group consisting of a planar, a concave, a convex, a parabolic, a multi-segmented, a curved surface, and a combination thereof. The reflecting surface 501 may be symmetrical or asymmetrical under all rotations about its center.

Figure 16:
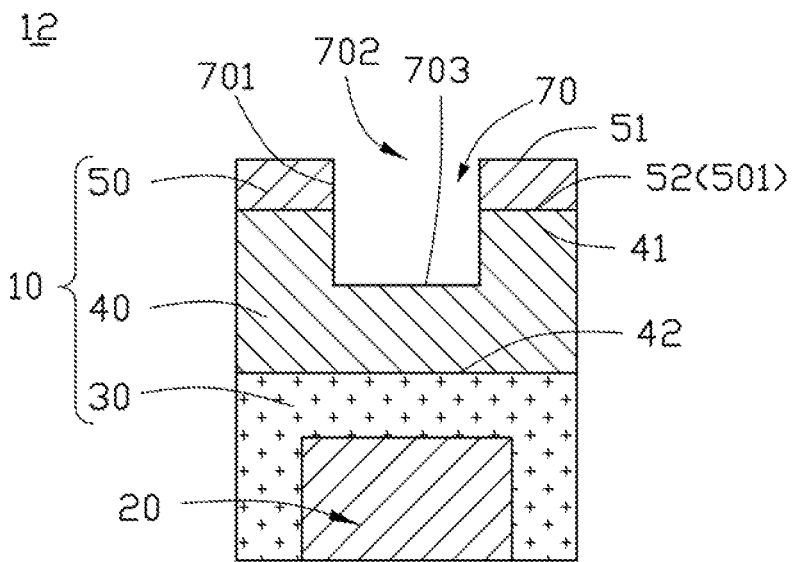
FIG. 16 is a schematic view of the light emitting diode assembly structure according to an twelfth exemplary embodiment.
Figure 17:
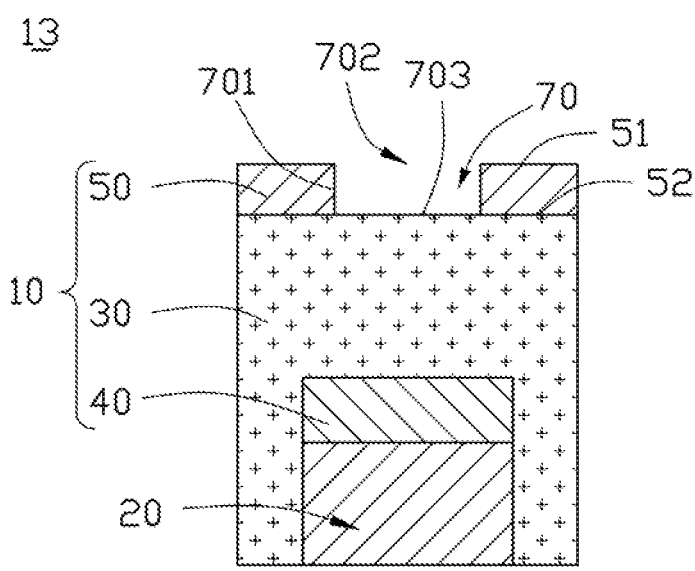
FIG. 17 is a schematic view of the light emitting diode assembly structure according to a thirteenth exemplary embodiment.

As shown in FIG. 16, in a twelfth embodiment, a light emitting diode assembly structure 12 is disclosed herein. The light emitting diode assembly structure 12 is a substantially consistent feature among the structures of the third exemplary embodiment. The light emitting chip 20 includes a top surface 21 in contact with the light color converting layer 30 and aligned with the reflecting surface 501 of the reflecting member 50. The light color converting layer 30 includes a top surface 31 in contact with the light guiding member 40 and aligned with the top surface 21 of the light emitting chip 20. The top surface 31 of the light color converting layer 30 is in opposite to the light emitting chip 20 and aligned with the reflecting surface 501 of the reflecting member 50. The light guiding member 40 includes a top surface 41 in contact with the reflecting member 50 and a bottom surface 42 in contact with the top surface 31 of the color converting layer 30. The reflecting member 50 includes a top surface 51 opposite to the light guiding member 40 and a bottom surface 52 in contact with the light guiding member 40. The difference is that the light emitting diode assembly structure 11 arranges a groove 70 above the reflective chip 20, and the groove 70 penetrates the top and bottom 51, 52 surfaces of the reflecting member 50 and the top surface 41 of the light guiding member 40 respectively. Specifically, the groove 70 penetrates from the top surface 51 of the reflecting member 50 to the top surface 41 of the light guiding member 40.

The groove 70 may penetrate from the top surface 51 of the reflecting member 50 to a predetermined position between the top surface 41 of the light guiding member 40 and the bottom surface 42 of the light guiding member 40.

The groove 70 may penetrate from the top surface 51 of the reflecting member 50 to a middle position between the top surface 41 of the light guiding member 40 and the bottom surface 42 of the light guiding member 40.

The groove 70 is applicable to the reflecting member 50 according to the sixth exemplary embodiment in the above modes or a combination thereof. The groove 70 can be a cross-shaped groove or a circular groove. The features of the trench 70 are not described here.

The reflecting member 50 is applicable to the reflecting member 50 according to the first exemplary embodiment in the above modes or a combination thereof. The reflecting surface 501 may be a surface selected from the group consisting of a planar, a concave, a convex, a parabolic, a multi-segmented, a curved surface, and a combination thereof. The reflecting surface 501 may be symmetrical or asymmetrical under all rotations about its center.

As shown in FIG. 18, in a thirteenth embodiment, a light emitting diode assembly structure 13 is disclosed herein. The light emitting diode assembly structure 13 is a substantially consistent feature among the structures of the fourth exemplary embodiment. The reflecting member 50 includes a top surface 51 opposite to the light guiding member 40 and a bottom surface 52 in contact with the light guiding member 40. The difference is that the light emitting diode assembly structure 13 arranges a groove 70 above the light emitting chip 20, and the groove 70 penetrates the top and bottom surfaces 51, 52 of the reflecting member 50. Specifically, the groove 70 penetrates from the top surface 51 of the reflecting member 50 to the bottom surface 51 of the reflecting member 50.

The groove 70 is applicable to the reflecting member 50 according to the sixth exemplary embodiment in the above modes or a combination thereof. The groove 70 can be a cross-shaped groove or a circular groove. The features of the trench 70 are not described here.

The reflecting member 50 is applicable to the reflecting member 50 according to the first exemplary embodiment in the above modes or a combination thereof. The reflecting surface 501 may be a surface selected from the group consisting of a planar, a concave, a convex, a parabolic, a multi-segmented, a curved surface, and a combination thereof. The reflecting surface 501 may be symmetrical or asymmetrical under all rotations about its center.

The light emitting diode assembly structure of the present disclosure defines the combined structure of the light emitting chip and the light guiding member, to improve the light irradiating efficiency and enlarge the irradiation range. The light guiding member surrounds the side of the color converting layer and the light emitting chip. The light emitted by the light emitting chip passes through the color converting layer and the light guiding member, and the light guiding member guides the light to irradiate towards the reflecting surface. The light onto the reflecting surface is reflected towards the light guiding member. Thus, the light emitted by the light emitting chip generates a first reflection, and the light reflected by the reflecting surface irradiates towards the exterior of the light emitting chip. Furthermore, when the light passes through the light guiding member, the light may be transmitted a farther distance according to a material property of the light guiding member. Thus, a reflected angle range of the light reflected by the reflecting member can be enlarged. In addition, the light emitting chip is arranged on the reflecting surface of the substrate. The light reflected by the reflecting surface of the reflecting member may irradiate towards the reflecting surface of the substrate. The light emitted by the light emitting chip is subjected to a second reflection, so that the illuminating range of such light is wider than the range directly emitted by a light emitting chip. The present disclosure also changes the structure of the reflecting member to change the light guiding path and the light pattern.

According to another light emitting diode assembly structure of the present disclosure, the reflecting member and the light guiding member surrounds the light emitting chip. More light emitted by the light emitting chip irradiates towards the reflecting surface of reflecting member by the light guiding member. The light emitted by the light emitting chip irradiating the reflecting surface of reflecting member is reflected towards the exterior of the package.

According to further another light emitting diode assembly structure of the present disclosure, the groove penetrates the first top and bottom surfaces of the reflecting member or penetrates the first top and bottom surfaces of the reflecting member and the second top and bottom surfaces of the light guiding member respectively. The groove is arranged over the light emitting chip. Thereby, the light emitted by the light emitting chip can pass through the groove to the exterior of the package for enhancing irradiation, so the problem that a luminescence of the light emitting chip is too dark is avoid, which is caused by the light exiting surface entirely configured as a reflective surface.

The exemplary embodiments illustrated and described above are only examples. Many details are often found in the art such as the other features of a light emitting diode assembly structure. Therefore, many such details are neither illustrated nor described. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the exemplary embodiments described above may be modified within the scope of the claims.

What is claimed is:

1. A light emitting diode assembly structure comprising:
    a light emitting chip having a top surface and a side surface extending from the top surface;
    a color converting layer coated on the light emitting chip and in contact with the top surface and the side surface of the light emitting chip;
    a light guiding member arranged over the light emitting chip; and
    a reflecting member arranged over the light guiding member,
    wherein the reflecting member comprises a top surface and an opposing bottom surface that contacts the light guiding layer,
    wherein the opposing bottom surface of the reflecting member in contact with the light guiding layer defines a first reflecting surface;
    wherein the reflecting member has a cross-shaped groove arranged projectively over the light emitting chip and exposing the light guiding member;
    wherein a width the groove is less than a width of the light emitting chip.

2. The light emitting diode assembly structure of claim 1, wherein the groove is substantially rotationally symmetrical about a center thereof in a plane.

3. The light emitting diode assembly structure of claim 1, wherein a width of the groove is in a range from about 0.05 mm to about 0.3 mm.

4. The light emitting diode assembly structure of claim 1, wherein the groove defines an upper end portion opposite to the light guiding member and a lower end portion adjacent to the light guiding member, and wherein a width of the upper end portion is more than or equal to a width of the lower end portion.

5. The light emitting diode assembly structure of claim 1, wherein a thickness of the light guiding member is more than a thickness of the reflecting member.

6. The light emitting diode assembly structure of claim 1, wherein the reflecting member is arranged entirely above the light emitting chip.

7. The light emitting diode assembly structure of claim 1, wherein the light guiding member comprises silicone and an additional material, wherein the weight of the additional material is within a range of about 5% to about 15% of the weight of silicone, and wherein the additional material is selected from a group consisting of organic diffusion particles, inorganic diffusion particles, and a combination thereof.

8. The light emitting diode assembly structure of claim 7, wherein a refractive index of the silicone is in a range of about 1.4 to about 1.6, and wherein a refractive index of the additional material is in a range of about 1.5 to about 1.8.

9. The light emitting diode assembly structure of claim 7, wherein the organic diffusion particles comprise an organic silicone compound or an acrylic compound, and wherein the inorganic diffusion particles comprise silica or a calcium carbonate compound.

10. A light emitting diode assembly structure comprising:
    a light emitting chip having a top surface and a side surface in connection with the top surface;
    a color converting layer coated on the light emitting chip and in contact with the top surface and the side surface of the light emitting chip;
    a light guiding member transparent to light emitted from the light emitting chip arranged over the light emitting chip and configured to guide output light from the light emitting chip to a predetermined position; and
    a reflecting member arranged over the light guiding member,
        wherein the reflecting member comprises a top surface and an opposing bottom surface that contacts the light guiding member,
        wherein the opposing bottom surface in contact with the light guiding member defines a first reflecting surface,
        wherein the light emitting diode assembly structure has a cross-shaped groove arranged projectively over the light emitting chip and extending from the top surface of the reflecting member into the light guiding member
        wherein a width of the groove is less than a width of the light emitting chip.

11. The light emitting diode assembly structure of claim 10, wherein the groove is substantially rotationally symmetrical about a center thereof in a plane.

12. The light emitting diode assembly structure of claim 10, wherein a width of the groove is in a range from about 0.05 mm to about 0.3 mm.

13. The light emitting diode assembly structure of claim 10, wherein the groove defines an upper end portion opposite to the color converting layer and a lower end portion adjacent to the color converting layer, and wherein a width of the upper end portion is more than or equal to a width of the lower end portion.

14. The light emitting diode assembly structure of claim 10, wherein a thickness of the light guiding member is more than a thickness of the reflecting member.

15. The light emitting diode assembly structure of claim 10, wherein the reflecting member is arranged entirely above the light emitting chip.

16. The light emitting diode assembly structure of claim 10, wherein the light guiding member comprises silicone and an additional material, wherein the weight of the additional material is within a range of about 5% to about 15% of the weight of silicone, and wherein the additional material is selected from a group consisting of organic diffusion particles, inorganic diffusion particles, and a combination thereof.

17. The light emitting diode assembly structure of claim 16, wherein a refractive index of the silicone is in a range of about 1.4 to about 1.6, and wherein a refractive index of the additional material is in a range of about 1.5 to about 1.8.

18. The light emitting diode assembly structure of claim 16, wherein the organic diffusion particles comprise an organic silicone compound or an acrylic compound, and wherein the inorganic diffusion particles comprise silica or a calcium carbonate compound.

* * * * *